United States Patent [19]

Hajj

[11] Patent Number: 4,526,670
[45] Date of Patent: Jul. 2, 1985

[54] AUTOMATICALLY LOADABLE MULTIFACETED ELECTRODE WITH LOAD LOCK MECHANISM

[75] Inventor: John G. Hajj, Amesbury, Mass.

[73] Assignee: LFE Corporation, Clinton, Mass.

[21] Appl. No.: 589,558

[22] Filed: Mar. 14, 1984

Related U.S. Application Data

[63] Continuation-in-part of Ser. No. 496,445, May 20, 1983, abandoned.

[51] Int. Cl.³ ............................................. C23C 15/00
[52] U.S. Cl. ..................................... 204/298; 118/50.1; 118/324; 118/719; 118/720; 156/345; 156/643; 427/82; 427/86
[58] Field of Search .......................... 204/298, 192 R; 156/643, 345; 427/82, 86; 118/50.1, 324, 719, 720

[56] References Cited

U.S. PATENT DOCUMENTS 3,890,217 6/1975 Burrows et al. ..................... 204/298
3,904,506 9/1975 Carmichael et al. ................ 204/298
3,908,183 9/1975 Ennis, Jr. ............................ 357/65
4,151,059 4/1979 Kuehnle ............................ 204/192
4,261,808 4/1981 Walter ................................ 204/298
4,278,753 7/1981 Lewis et al. ........................ 156/643
4,298,443 11/1981 Maydan ............................ 204/192
4,392,915 7/1983 Zajac ................................. 156/643
4,397,724 8/1983 Moran .............................. 204/192

Primary Examiner—Arthur P. Demers
Attorney, Agent, or Firm—Lahive & Cockfield

[57] ABSTRACT

Automatic loading mechanism for automatically transferring semiconductor wafers from storage cassettes onto disk shaped electrodes carried on a hexagonal electrode structure within a plasma reaction chamber. The system includes a reactor chamber, a transport mechanism for transporting semiconductor wafers from storage cassettes and to storage cassettes and a loading mechanism for transferring semiconductor wafers from said transport mechanism onto the electrode structure within the reactor chamber and for transferring processed wafers from said reactor chamber back to said transport means for transport to an output cassette.

27 Claims, 28 Drawing Figures

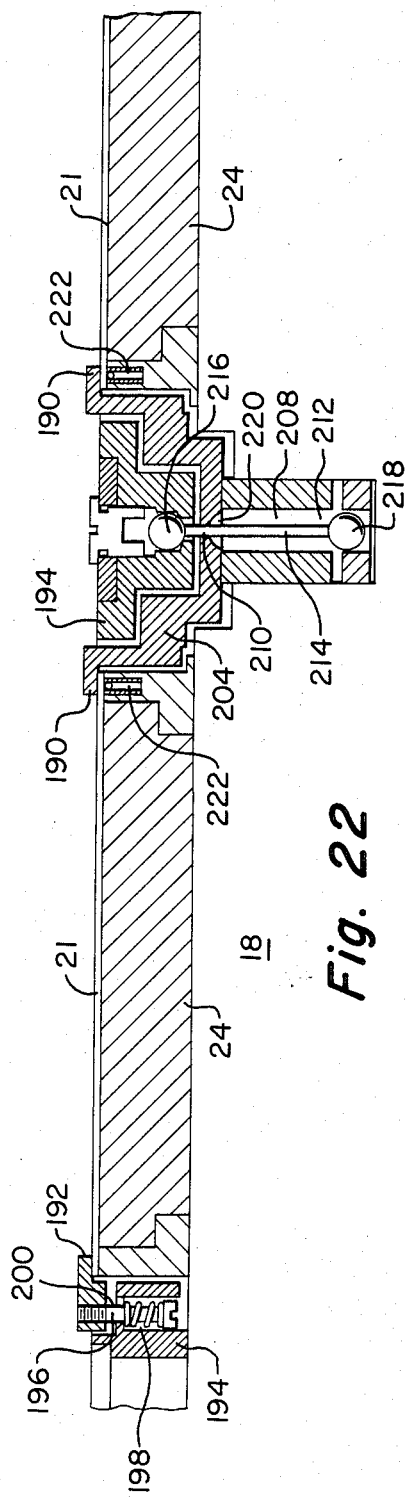
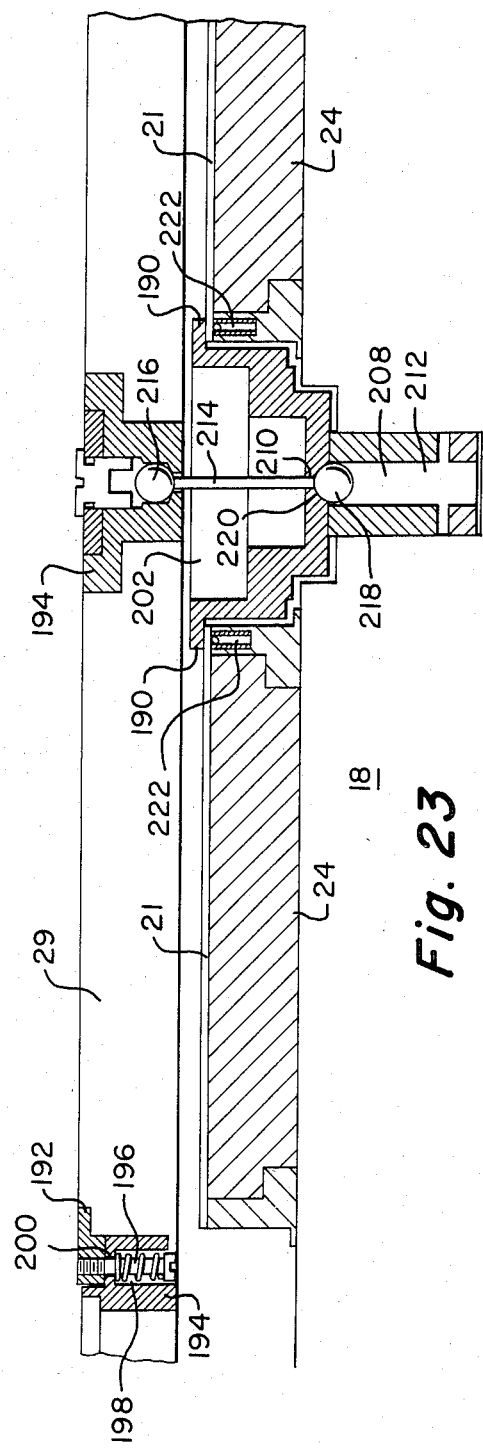
Fig. 22
Fig. 23

AUTOMATICALLY LOADABLE MULTIFACETED ELECTRODE WITH LOAD LOCK MECHANISM

REFERENCE TO OTHER APPLICATIONS

This application is a continuation-in-part of Ser. No. 496,445, filed May 20, 1983, now abandoned.

This invention relates in general to semiconductor processing and more particularly to a gas plasma reaction system for processing semiconductor wafers including mechanisms for automatically loading and unloading the wafers into a reaction chamber.

Semiconductor devices are typically manufactured in four inch, generally circular wafers, which are processed by both etching and depositing materials in dry plasma processes. In these processes wafers are inserted into an evacuated chamber, which is then pressurized with appropriate gas compositions to carry out the processing in a plasma produced within that chamber by the application of a radio frequency field. There are, of course, a number of different geometric configurations for this processing. Some involve multiple wafer processing and others employ chambers which process but a single wafer at a time. In general, high throughput is a desirable characteristic of any such system, as is also automatic loading and unloading features which permit continuous or semicontinuous processing.

One advantageous chamber configuration is illustrated in U.S. Pat. No. 4,298,443. In this system, the reaction chamber includes a multifaceted central electrode structure, typically a hexagon, in which the central electrode is a cylinder of hexagonal cross-section with each side of the hexagon being formed of an extended flat face, each face having on it several disk shaped planar electrodes on which the semiconductor wafers are placed during processing. The system is operated by manually loading semiconductor wafers on each of the electrode faces, with the hexagonal cylindrical structure vertically oriented and then lowering the outer wall of the chamber over this electrode, evacuating the chamber and subsequently filling it with gas for the processing itself. The process involved is then a batch process and it is not provided with any automatic loading and unloading features.

SUMMARY OF THE INVENTION

Broadly speaking, the present invention provides a system for automatically loading and unloading semiconductor wafers into a plasma reaction chamber having a multifaceted central electrode structure, wherein each face of the electrode structure carries a number of wafers on planar disk shaped electrodes. In general, the system may be considered as having three major components: the reaction chamber, which includes the faceted central electrode, a transport mechanism for carrying individual wafers from storage containers to the reaction system for processing and for carrying processed wafers away from the reaction system to either storage or to the next stage in processing, and a load/unload mechanism for receiving wafers from the transport system and automatically loading them onto the disk shaped electrodes in the reaction chamber prior to processing, and for removing the wafers from the electrodes after processing and returning them to the transport mechanism.

The reaction chamber must be evacuated prior to being filled with reaction gas and, in order to facilitate this process, the load/unload mechanism is contained within a vacuum lock chamber connected through a slit valve to the reaction chamber. The transport mechanism is operated under ambient atmospheric conditions.

In order to effect the transfer of the wafers from the transport mechanism to the loading system and from the loading system to the transport mechanism, the loading system is sealed by means of the slit valve from the reaction chamber and is allowed to come to ambient atmospheric pressure. The wafers are transferred from the transport system through a loading port to and from the load mechanism, the loading port is thereafter sealed and the housing containing the loading and unloading mechanism is evacuated prior to opening the slit valve for the actual loading and unloading process into the reaction chamber. The multifaceted, typically hexagonal, electrode structure is rotatable about its axis and the system may be operated either by loading all of the faces of the electrode structure with wafers and thereafter processing for the full processing time prior to unloading or, alternatively, one face may be loaded, and, in the case of a hexagonal structure, one-sixth of the processing time may take place prior to rotation of the structure and loading of the next face.

The plasma reactor chamber has a centrally located electrode structure formed of a series of longitudinally extended faces, each of the faces being positioned so that in cross-section the electrode structure has a regular polygonal shape, the faces being extended in a horizontal direction, each of the faces having on its surface a plurality of planar disk shaped electrodes for carrying semiconductor wafers to undergo the plasma reaction during operation, each of the faces being covered by a generally flat tray member having circular openings therein corresponding to the positions of the electrode disks, each of the trays being hinged for pivotal motion from a first position in close parallel juxtaposition with the electrode face to a second position angularly displaced therefrom.

A loading mechanism is disposed generally beneath the reaction chamber, the loading mechanism including a plurality of vertically extending support arms, each of the support arms being configured to carry a semiconductor wafer and formed such that the reactive surface of the semiconductor wafer is not touched by any portion of the vertically extending arm, the number of vertically extending arms being at least equal to the number of electrode disks on a single face of the reactor electrode structure.

The system includes means for imparting motion to the arms for moving the arms from a position beneath the reactor chamber to a position within the reactor chamber such that each arm is in close juxtaposition to a corresponding one of the disk electrodes, and for thereafter withdrawing the arm from the position in close juxtaposition back to a position beneath the reactor chamber, and control means for controlling the timing of the load mechanism motion such that the arms are moved into and away from close juxtaposition to the disk electrodes only when the tray members are in the second angularly displaced position.

The system may further include a plurality of resilient members mounted around the periphery of each of the circular openings in the tray elements, the resilient members being formed such that when the tray element is in its first position the resilient members clamp a semiconductor wafer to the disk shaped electrode and when the tray member is in its second position the resilient members are not clamping the semiconductor wafers to the disk shaped electrodes.

Preferably, the tray member has a third position in which it is angularly displaced from its first position by an amount less than the angular displacement of its second position and the electrode faces include at least two additional resilient members mounted thereon such that when the tray element is in its third position, the additional resilient members can retain a semiconductor wafer in position on the disk shaped electrode and when the tray element is in its second position, the additional resilient elements release the semiconductor wafer from its position on the disk shaped electrode. The control means operates the vertical arm such that the tray element is moved to its second position and thereafter the arms are moved vertically into close juxtaposition with a corresponding one of the disk shaped electrodes such that each semiconductor wafer carried on each arm is positioned on and generally concentric with a corresponding one of said disk shaped electrodes, and thereafter the tray element is moved to its third position, such that the additional resilient members mounted on the electrode face retain the semiconductor wafer carried by the corresponding vertical arm onto the disk shaped electrode, the control means operating while the tray element is in its third position to cause the reciprocating means to withdraw the arms from within the reaction chamber to a position beneath the reaction chamber and to cause the tray element to move to its first position after the vertical arms have withdrawn to a position below the electrode face.

Also, the control means operates the vertical arms and the tray elements during an unloading cycle in a sequence such that the tray element moves from its first position to its third position, thereafter the vertical arms are reciprocated into position to accept the semiconductor wafers from a corresponding one of the disk shaped electrodes, then the tray element is moved to its second position to release the semiconductor wafers from the disk shaped electrodes, and then the vertical arms are reciprocated to a position beneath and outside of the reaction chamber.

The load mechanism may comprise a pair of blade elements mounted within the housing positioned beneath the reaction chamber, means for imparting reciprocating vertical movement to the blades, the vertical arms consisting of a first group, equal in number to the number of disk shaped electrodes on each face of the electrode structure, and a second group equal in number to the first group, the first group being mounted on a first one of the blades, and the second group being mounted on a second one of the blades, and means for imparting pivotal movement to the blades such that in a first pivoted position the first group of vertical arms are positioned so that upon reciprocating movement they are carried into close juxtaposition with the disk shaped electrodes and in a second pivoted position, the second group of vertical arms are positioned such that upon reciprocating upward movement they are carried into close juxtaposition with the disk shaped electrodes, the control means being operated such that one group of vertical arms carries semiconductor wafers from the transport mechanism into position on the disk shaped electrode when the blades are in one pivoted position and the other group of vertical arms carries semiconductor wafers from the disk shaped electrodes when the blades are in the second pivoted position.

The vertical support arms may be each formed of a support strut and a spring clip positioned to hold a semiconductor wafer against the support strut, the spring clip having a cam tip shaped such that when the arm moves into close juxtaposition to the disk electrodes, the cam tip is moved behind the disk electrode, moving the spring clip away from the semiconductor wafer, and freeing the wafer such that it is retained on the support strut only by gravity.

The load mechanism may include a housing formed with a passage between it and the reaction chamber, and means for providing a vacuum tight seal between the housing and the reaction chamber when the arms are in position beneath and outside of the reaction chamber, the housing having a second opening for receiving semiconductor wafers from the transport mechanism only when the reaction chamber passage is closed, and means for providing a vacuum tight closing for the opening.

The transport mechanism preferably includes a conveyor system for moving the semiconductor wafer from a cassette into individual spaced positions adjacent to the second opening, means for opening the vacuum tight closing, and wafer carrier means for lifting the wafers from the conveyor, through the second opening into a position adjacent to the loading mechanism such that the loading mechanism in its upward reciprocating motion can transfer the wafers from the carrier to the vertical arms.

The carriers may be generally rectangular shaped vacuum chucks mounted on swing arms, and the system includes means for providing a vacuum to the chucks to retain the wafers on the chucks when the carriers are moving the wafers from the transport mechanism to the loading mechanism vertical arms, and to remove the vacuum when the vertical arms have engaged the wafers.

Alternatively, the support arms are each formed of a support strut and a pawl means for holding a semiconductor wafer against the support strut, including vertically movable means on which the pawl means is mounted, whereby when the arm moves into close juxtaposition to the disk electrodes, the pawl means is moved down from the semiconductor wafer, freeing said wafer such that it is retained on the support strut only by gravity. Furthermore, the vertically movable means preferably includes a movable pawl support, resiliently mounted on the vertical support arm, and guide means for guiding the movable pawl support, the guide means being arranged to guide the movable pawl support so that the pawl means is moved transversely away from the semiconductor wafer as well as down from the wafer when the arm moves into close juxtaposition to the disk electrodes. Also, the pawl means may have an electrode contact surface for contacting the disk electrode to cause the pawl means to move down from the semiconductor wafer as the arm moves into close juxtaposition to the disk electrode.

Also, the system may include a ring of insulating material defining the circular openings in the tray elements, the resilient members being mounted in the ring on support elements, and the ring defines bores in which the support elements are slidable.

In an alternative embodiment, the additional resilient members comprise a block means and a tab means mounted on the block means, the disk electrode face defining a recess for resiliently, closely seating the block means, and linking means connecting the block means to the tray element whereby the tray element moves the block means from a position in which the tab means engages the semiconductor wafer to a position in which the tab means does not engage the wafer when the tray element moves from the tray element third to the tray element second position. Biasing means urges the tab means mounted on the block means toward engagement with the semiconductor wafer, the block means defining a bore through which the linking means extends to engage the block means, the tray element defining a portion closing off the bore when the tray element is in its first position.

DESCRIPTION OF THE DRAWINGS

In the drawings:

FIG. 22 is a sectional view, along the line 22—22, of the tray, wafer and electrode structure of FIG. 21;

FIG. 23 is a sectional view like that of FIG. 22, showing the tray in its intermediate position;

DESCRIPTION OF PREFERRED EMBODIMENT

Figure 1:
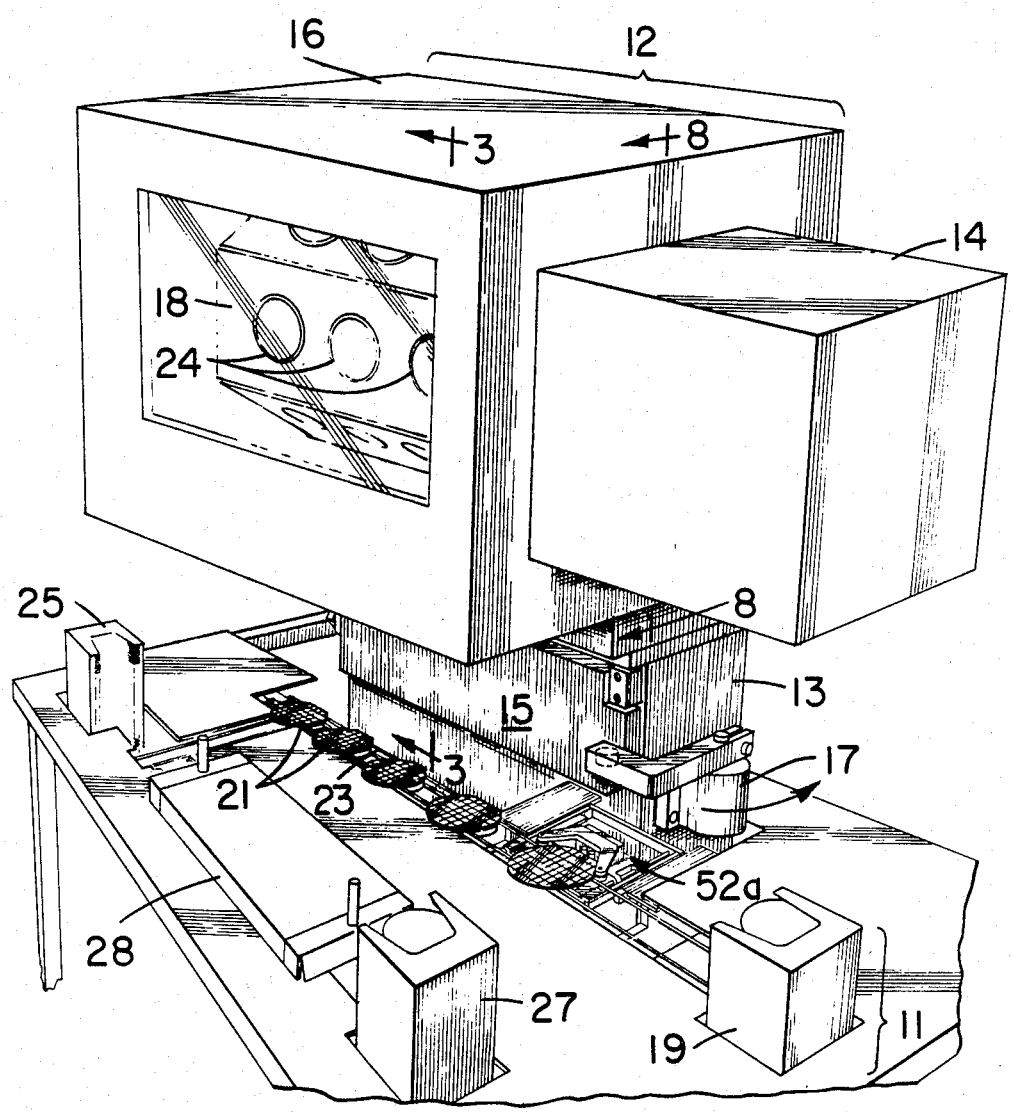
FIG. 1 is an illustration generally in perspective view of a gas plasma reaction system constructed in accordance with the principles of this invention.

In FIG. 1 there is illustrated in perspective view a semiconductor processing system. It includes a transport system generally indicated at 11, a loading system generally indicated at 13 and a plasma reaction chamber generally indicated at 12. The purpose of this system is to provide for automatic processing of semiconductor wafers in the plasma reaction chamber. The wafers, which are illustrated at 21 in FIG. 1, are standardized in the industry and are a four inch circular wafer having one surface which is to be treated, either by etching or deposition, which is the sensitive surface. Each of the wafers has a primary flat side for purposes of orientation. In the semiconductor processing industry there is at present a standardized cassette which loads twenty-four of these wafers. In the operation of the present system, a cassette is placed in dispensing position 19 from which the wafers are fed one at a time onto a belt conveyor system formed of two generally parallel strands 23 and 48 which carry the wafers first to a wafer flat orientation station 52a. Once the wafers have been aligned with the flat side in a specific position, they are transported further along until a parallel array of four wafers, as illustrated in FIG. 1, is positioned above each of four individual transport carriers, shown more clearly in FIGS. 2 and 3. The individual wafers are now in a position to be transferred to the loading mechanism 13 by opening the vacuum tight closure 15 covering the loading port 51.

The plasma reaction chamber is formed of a gas-tight housing 16 enclosing within it a hexagonal electrode 18, which carries on each of its faces a series of disk shaped electrodes 24. The hexagonal electrode structure is rotated by a drive mechanism operated by a control system, both included in housing 14. In operation the electrode structure can be rotated to bring, in any desired sequence, each of the faces of the hexagon to proper alignment positions for a loading action. Details of such a hexagonal electrode system are described in U.S. Pat. No. 4,298,443. The reaction chamber 12 is coupled through a slit valve 22 to the loading mechanism 13.

During the loading portion of the cycle, the function of the loading mechanism 13 is to transfer the semiconductor wafers 21 from their respective carriers elements 30 to transfer elements within the loading mechanism. Once the transfer to the transfer elements has been completed, the loading port 51 is resealed with door 15, and the housing of the load mechanism 13 is evacuated with slit valve 22 closed. Once both the load mechanism 13 and the reaction chamber 12 have been evacuated, slit valve 22 is opened and the loading mechanism is actuated to transfer the semiconductor wafers from the loading mechanism into position on the disk shaped electrodes 24. In the unload cycle, the reverse of this process is carried out and the semiconductors which have undergone the processing are transferred back to the carrier elements 30 on the transport mechanism and then are released to the belt conveyor which carries them either to output cassette 27 or to a buffer station 25, which may for example be used to store wafers until a photoresist stripper element 28 is empty.

THE TRANSPORT SYSTEM

Figure 2:
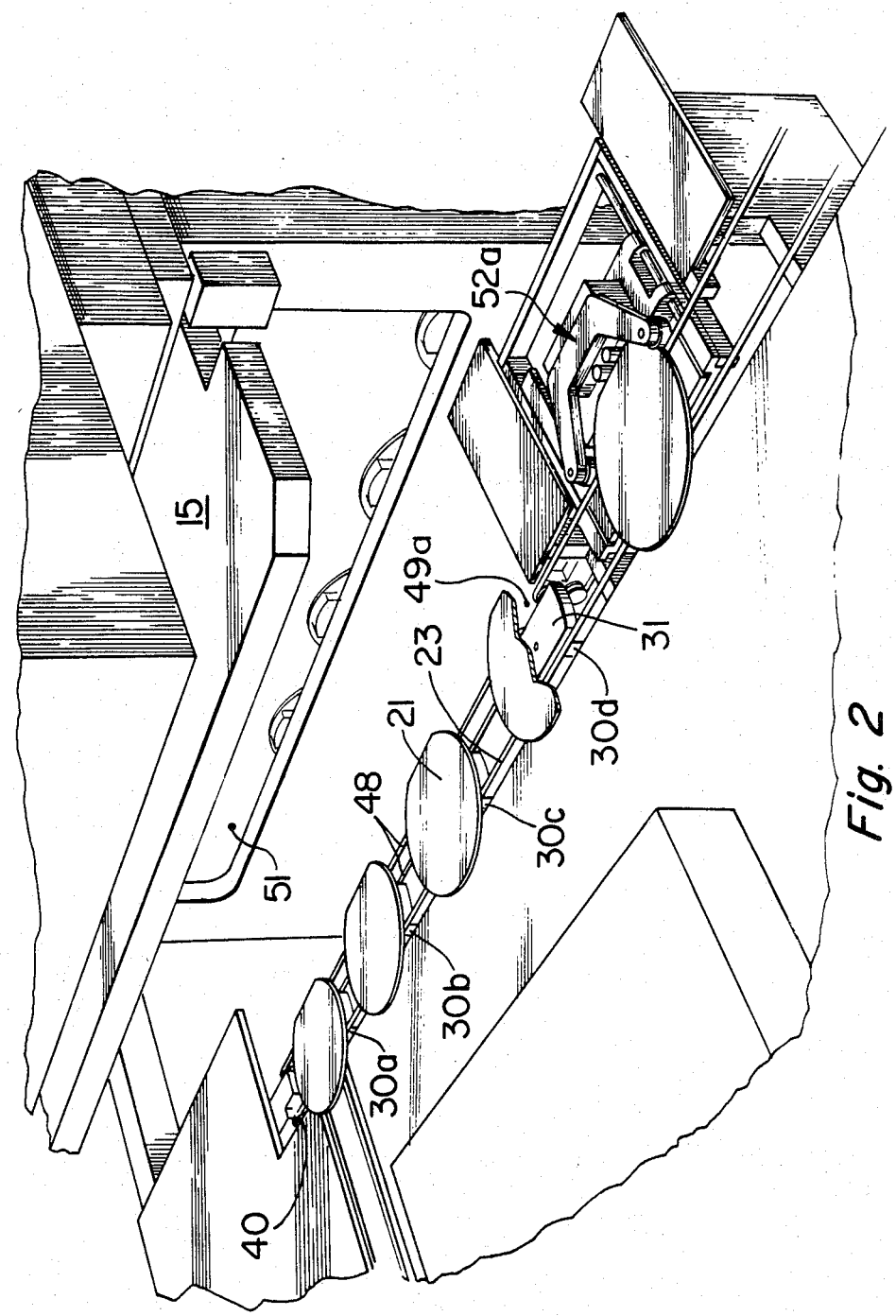
FIG. 2 is an illustration in perspective view of a transport mechanism which forms a portion of the semiconductor processing system constructed in accordance with the principles of this invention.
Figure 3:
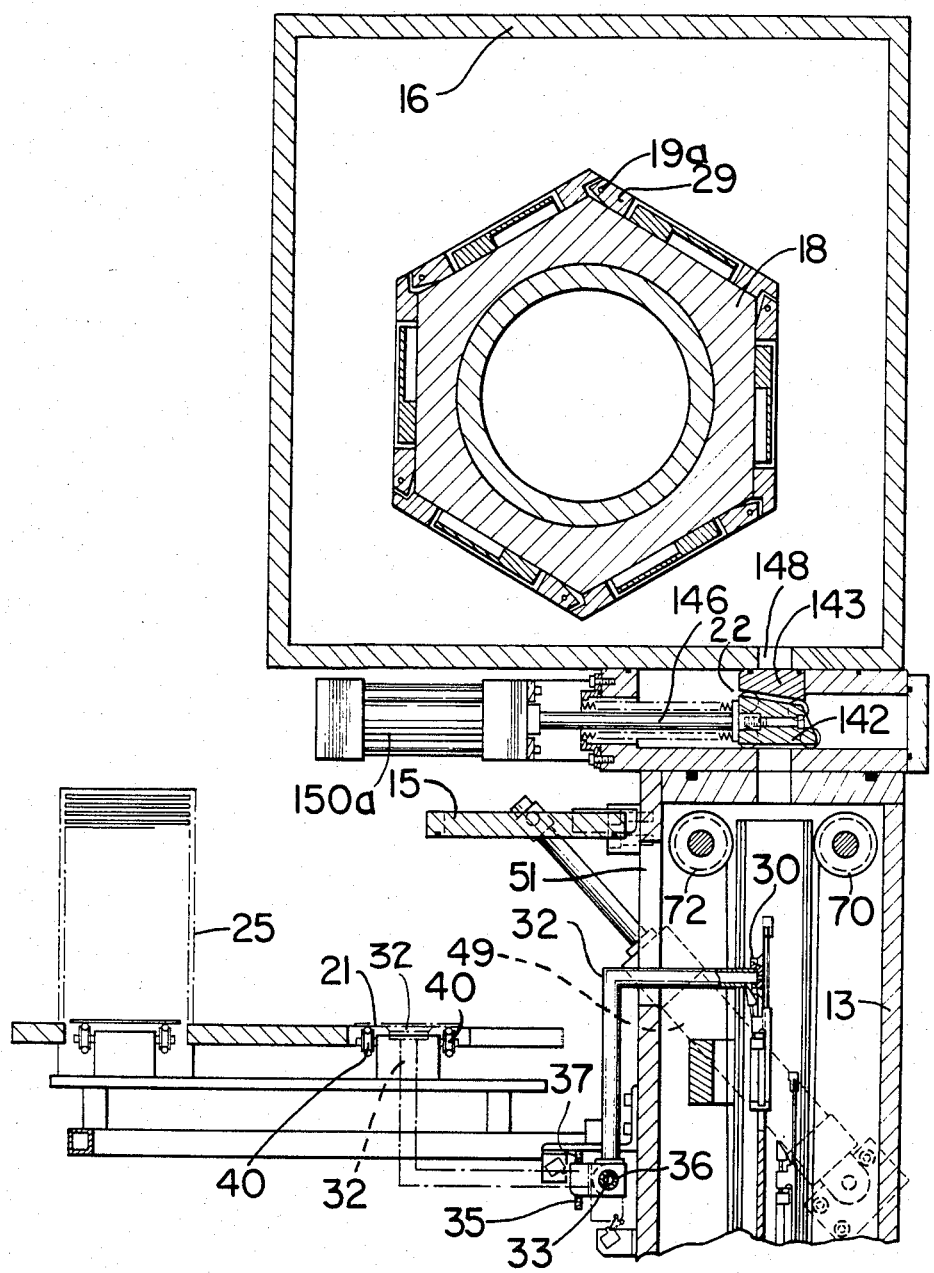
FIG. 3 is an illustration in cross sectional view taken along the line 3—3 of FIG. 1 of a portion of a semiconductor processing system constructed in accordance with the principles of this invention.
Figure 4:
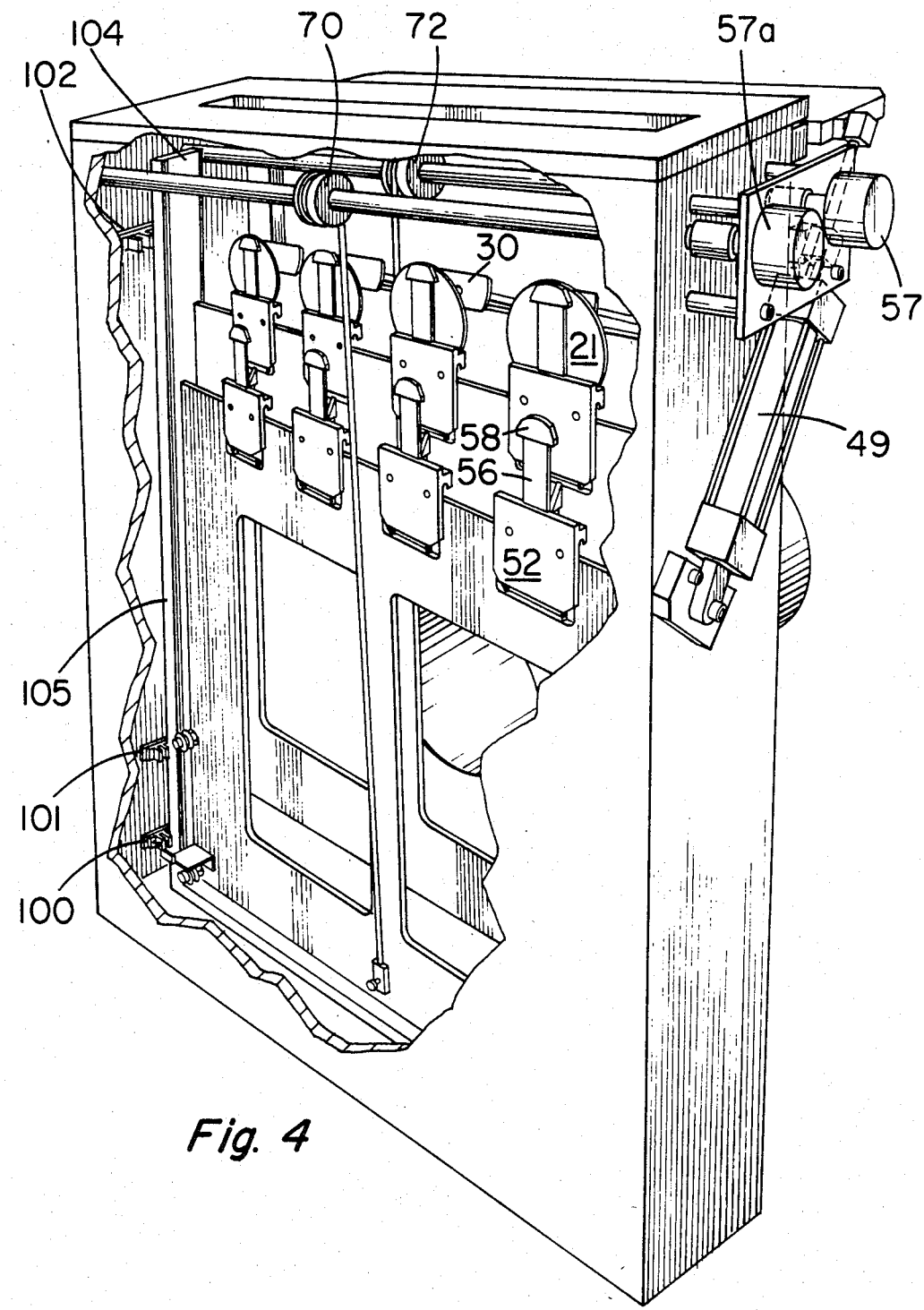
FIG. 4 is an illustration from the rear with a portion shown in partially cutaway view of a load mechanism assembly which forms a portion of the semiconductor processing system constructed in accordance with the principles of this invention.
Figure 4A:
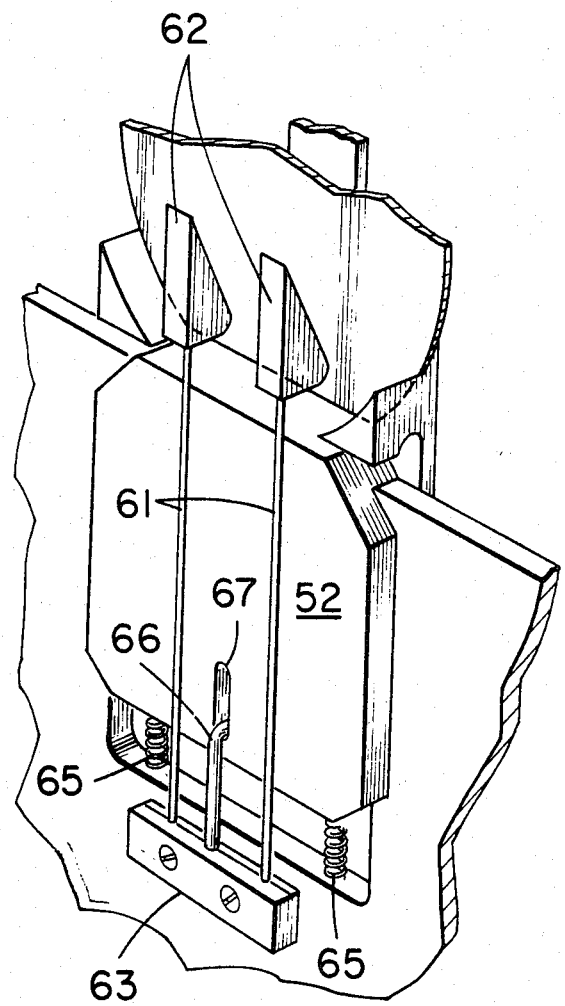
FIG. 4a is a partial perspective view of the wafer holder locking in its appropriate directions from that of FIG. 4.
Figure 5:
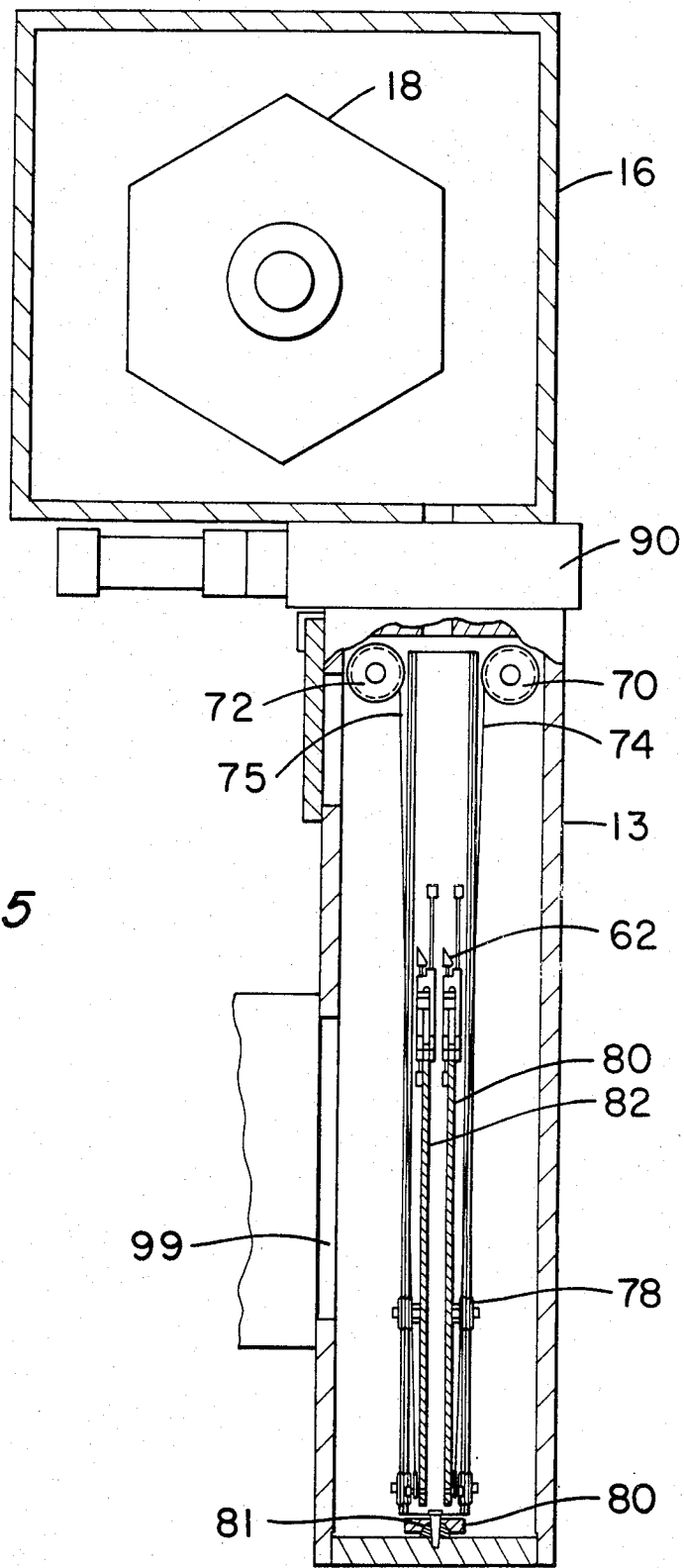
FIG. 5 is an illustration partially in perspective and partially in breakaway cross section view of a load mechanism assembly system of FIG. 1.
Figure 6:
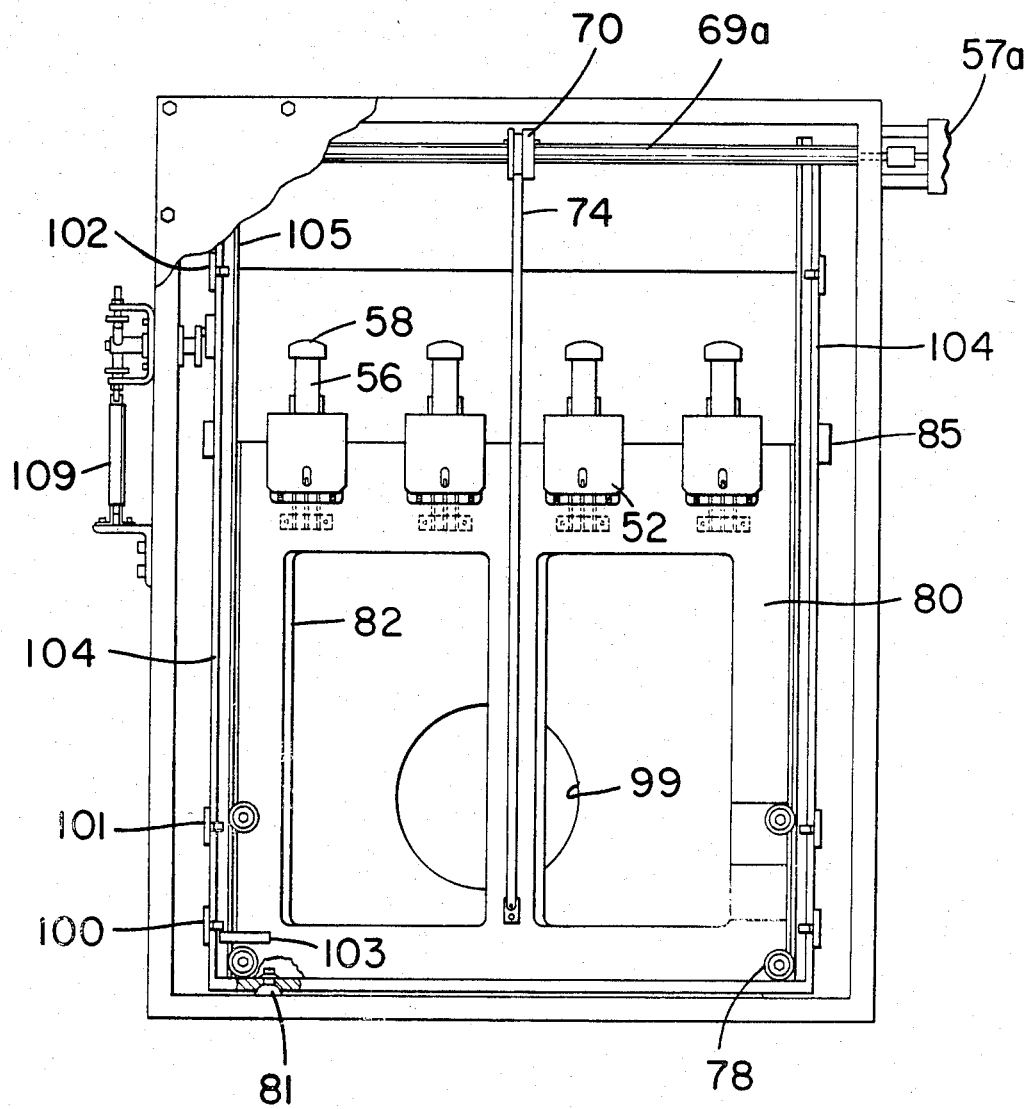
FIG. 6 is a rear elevation of the load mechanism assembly of FIG. 1 with portions broken away.
Figure 7:
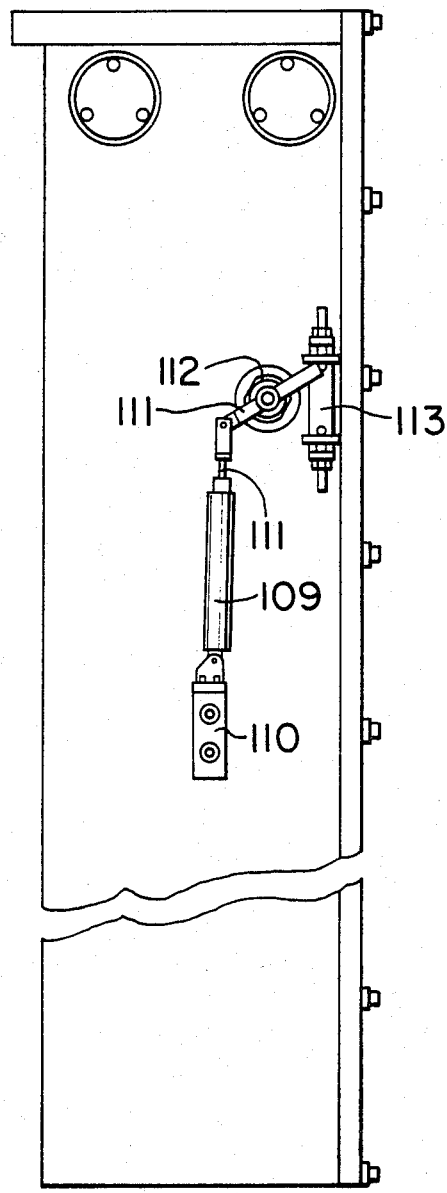
FIG. 7 is a side elevation of the load mechanism assembly.

The transport system 11 is most clearly illustrated in FIGS. 1, 2 and 3. As above mentioned, the function of the transport system is to convey the semiconductor wafers from the dispenser cassette 19 to bring them into position to be transferred directly to the loading mechanism. It is also a function of the transport system to accept the transfer of processed wafers from the loading mechanism and convey them to either an output storage cassette 27 or to a photoresist stripper or other additional processing stage, generally indicated in FIG. 1. The storage cassettes are standard in the industry and will not be described further here. The basic conveyor system is shown as a rubber belt system with a single outer strand 23 carried over a series of pulleys 40. Parallel with the outer strand 23 are a series of shorter rubber belts 48 forming a segmented track with the openings 49a between the segments 48 providing clearance for passage of the carrier arms 30 rotating up to the position shown in FIG. 3. The belts 23 and 48 are driven by a step motor programmed sequence so that the wafers, as they are removed from the dispenser 19, are carried under influence of the programmed control (not shown) to each of the desired station. After removal from the dispensing cassette 19, the first station at which each wafer is stopped is the flat orientation device 52a, which is described in detail in an application filed of even date herewith and assigned to the assignee of this application. After each wafer is aligned with its flat in a specific position, it is moved along the conveyor to a position over an appropriate one of the carrier elements 30. Thus the first wafer of each group of four conveyed from the dispensing cassette 19 is carried by the conveyor up to the position overlying carrier element 30(a), while the next in the sequence is carried to a position overlying carrier 30(b), the next to a position overlying carrier 30(c) and the fourth to a position overlying carrier 30(d).

The carrier elements are formed of generally rectangular pedestals 31 welded or otherwise attached to tubular right-angled arms 32 which are mounted on rotating shaft 36.

Shaft 36 is rotated by a small DC motor (not shown) under the control of the program control to drive the carrier arm 30 from its normal, or rest, position as indicated in phantom in FIG. 3 to one of two transfer positions, as generally indicated in FIG. 3 where the vacuum chuck 31 is positioned to transfer the semiconductor wafers to or from the loading mechanism. In its rest position the carrier arms 32 are mechanically stopped in the position shown in phantom in FIG. 3, and in the transfer position, the arms are mechanically stopped in either of two positions, one corresponding to the transfer position when one blade of the loading mechanism is reciprocating for effecting the transfer of the wafers, and the other corresponding to the transfer positions when the other blade in the load mechanism is effecting the transfer. These latter stops can be accomplished, for example, by a fixed screw 35 representing the stop for the transfer position at the maximum arc from the rest position, while adjustable air cyclinder controlled stop 37 is employed for the transfer position intermediate the maximum pivot arc and the rest position.

When each of the wafers 21 are positioned over the respective carrier arms in their normal position, a vacuum is drawn through the hollow tubing of the right angled tube 32 so that the vacuum chuck 31 has a vacuum being drawn through a small central hole. The shaft 33 is then rotated such that the vacuum chucks 31 lift the wafers 21 from the conveyor belts. The wafers are now held by the vacuum chucks 31, and the motion of the arms 30 is continued until the vacuum chucks are in one of the two positions indicated for transfer of the wafers.

Prior to rotating motion being imparted to the carrier arms 30, an electrically actuated hydraulic or air piston 49 is actuated to open the load lock cover 15 to allow for passage through the load lock 51 of the carrier arms 30. A latch mechanism for maintaining the port cover 15 in a vacuum tight seal when closed is provided by a latch arm 17(a) driven by a rotary motor 17 so that, when the cover 15 is to be opened the latch arm is rotated out of the way, and after it is closed it is rotated in the opposite direction to ensure a vacuum tight seal.

What has been above described is the operation of the transport system during the load cycle. In the unload cycle, when the loading mechanism has removed already processed wafers from the electrode assembly 18 and the wafers are in position to be transferred to the transport system, the program controller opens the cover 15 of the load lock port 51 and causes the carrier arms 30 to be rotated into position adjacent to the path of travel of the wafer elements in the load mechanism. The exact mechanism for effecting the transfer from the load mechanism to the wafer and the operation of that mechanism will be described subsequently in the section directed to the loading mechanism. When the carrier arms 30 are in position to receive the processed wafers, a vacuum is again drawn on the vacuum chucks so that the wafers may be transferred to the carrier arms and the vacuum chucks 31 will retain the wafers, while the carrier arms rotate back toward the normal or rest positions, and, as the wafers are brought into contact with the rubber belts of the conveyor system the vacuum is removed. The conveyor belts then carry the processed wafers to the photoresist strip station 28 or to the buffer cassette 25 if the photoresist strip station 28 is occupied or may be carried directly to the receiver cassette 27.

THE LOAD MECHANISM ASSEMBLY

The function of the loading mechanism is to receive the semiconductor wafers 21 from the transport system and load them onto the individual disk electrodes 24 in the hexagonal electrode structure 18. Since the plasma reaction chamber 12 is operated at very low pressures and requires accurate control of the purity of the gases, it is advantageous from an efficiency point of view to maintain the atmosphere within the chamber 12 either at vacuum or at the low gaseous pressure. Accordingly, when the loading mechanism 13 is opened through slit valve 22 to move the wafers either into or out of the reaction chamber, it is desirable that the environment within the loading mechanism be maintained at vacuum. On the other hand, when wafers are being transferred from the transport system through the loading port 51 to the loading mechanism, the loading mechanism must necessarily be exposed to the ambient pressure. Accordingly, the loading mechanism assembly is contained within a generally vacuum tight housing 13 provided with a loading port 51 providing access to it from the outside atmosphere, with the loading port 51 having, as indicated above, a cover 15 which can be opened to permit transfer of wafers through the port or closed to form a vacuum tight seal. When the loading port 51 is open, then slit valve 22 which provides for a vacuum tight seal between the housing 13 and the reaction chamber 12 is closed to seal the interior of the reaction chamber 12 from the outside atmosphere. After the loading, or unloading, step between the transport system and the loading mechanism has been completed, the load port cover 51 is closed, providing a vacuum tight seal and the interior of the loading mechanism housing 13 can then be evacuated prior to opening the slit valve 22 and transporting wafers to the reaction chamber 12.

The details of the loading mechanism assembly are most clearly shown in FIGS. 4, 4a, 5, 6 and 7. The mechanism includes a frame 104 pivotally mounted at pivot points 81 within the chamber with the frame being given pivotal motion back and forth by virtue of cyclinder 109 driving an arm 111 on an eccentric shaft 112. A physical limit stopping element 113 provides that the frame has only two positions, one in which it is tilted forward toward the transport system and one in which it is tilted away from the transport system. The frame 104 has mounted in it for vertical reciprocating motion a pair of blade elements 82 and 80. Each blade travels on a pair of rails 105 formed on the inner portion of the frame 104 with wheels 78 on the blades engaging the rails for guiding the vertical movement. Each of 80 and 82 can be moved vertically on the frames by virtue of individual stainless steel straps 74 and 75 attached to the frame and around capstans 70 and 72 on shafts 69 and 69a. Each of the shafts are rotated by respective motors 57 and 57a which, when rotated in one direction, cause the respective blade to be raised and in the other allow the respective blade to drop.

Each of the blades 80 and 82 carries a series of four vertical support arms, or paddles, 52 laterally spaced to correspond to the spacing of the disk shaped electrodes 24 on the hexagonal electrode structure 18. The paddles include the base element 52, formed of a suitable material such as Teflon (TFE). Extending vertically from each of the base members 52 is a flat metal spring element 56, capped with a retaining top 58. The paddle elements 52 are mounted in cutout slots in the respective blade and supported by springs 65, thereby allowing a small amount of resilient vertical movement of the paddle with respect to its supporting blade. Both the cap 58 and base member 52 of the paddle have recesses such that a semiconductor wafer can be supported on the ridge on the base portion 52 and against the ridge in the cap element 58 (as is particularly shown in FIG. 14) so that only the outer rim of the wafer touches the support arm when a wafer is positioned on it. This prevents contamination or damage to the sensitive surface of the wafers 21.

In its vertical travel each blade has three vertical positions, a lowermost position, an intermediate position in which the support arms are generally aligned with the loading port 51, and an upper position in which the support paddles 52 are positioned adjacent to the disk shaped electrodes 24. The position of the blade for each of these positions is determined by a series of optical sensors 100, 101, and 102, each of which are formed with a light emitting diode and a light sensor positioned such that when the tab element 103 attachned to each blade passes through the sensor, a signal is generated to the program controller. Thus, depending upon the sequence being followed by the program control, the motors 57 and 57a are stopped to position the blade at the appropriate vertical stop.

Each of the support arms in 52 also provided with a pair of spring clips 61, capped with a cam element 62 with the spring clips being mounted directly to the respective blade through a block 63. A pin 66 mounted in the block extends through a slot opening 67 in the paddle base 52 and provides a limitation on the travel of the paddle 52 with respect to the slot in the blade. The spring clips 61 serve to hold the semiconductor wafers 21 in position on the support arms 52 while the arms are in transit between the transport system and the electrode structure.

By including the pair of blades 80 and 82 in a tilting mechanism, the sequence can be arranged such that after the slit valve 22 is opened, and while the housing 13 of the load mechanism assembly remains pumped down to a vacuum, wafers may be loaded or unloaded from one face of the hexagonal electrode structure 18 and then with rotation of the electrode structure, the second blade may load or unload wafers from a second face of the electrode.

THE ELECTRODE STRUCTURE

The details of construction of the electrode structure 18 are illustrated in FIGS. 8 through 13. The electrode structure is formed of a frame 18 which is hexagonal in cross section, and includes on each face of the hexagon a series of disk shaped electrodes 24, formed of a highly conductive metal such as aluminum. Each face is covered by a rectangular tray element 29, which may be formed of metal and coated with an insulating surface. Tray element 29 is connected to the main structure 18 through a hinge element 19a, which allows the tray element 29 to swing from its position in close parallel contact with the face of the electrode structure to two positions angularly displaced from it. This motion is provided by a crank 150, driven by a rack and pinion arrangement, which is mounted outside of and therefore does not rotate with the hexagonal frame 18. The crank 150 engages a tab 128 on the edge of each of the tray elements 29 when the respective face is in alignment with the crank arm 150. A series of springs 132a are mounted to bias the tray element 29 toward a closed position in contact with the electrode structure 18 and the force of the crank arm overcomes this spring resistance in moving the tray element to the angularly displaced positions. Each of the tray elements 29 has a series of circular openings therein corresponding to the position of the disk shaped electrode and each opening has affixed to it a series of four resilient members 120, which may be formed of a suitable material such as a thermoplastic polyarylate manufactured by Union Carbide Corp. under the trade name of "Ardel". As is illustrated most clearly in FIG. 11, tab elements 120 are fastened to the tray element with spring elements to provide them sufficient resilience to retain wafer disk 21 in position over electrode face 24 when the tray 29 is in the closed position.

An additional pair of resilient tab elements 122 is fastened to each of the faces of the hexagon by leaf springs 132. When the tray element 29 is in the partially opened position, these elements 122 retain a wafer 21 in position on the face of the disk electrode 24. On the other hand, when the tray element 29 is pivoted to its outermost position, the arm 130 attached to it pushes the resilient tabs 122 forcing them outwardly away from the face of the disk electrode 24, thereby releasing any semiconductor wafer 21 which was being retained by these tabs.

Figure 16:
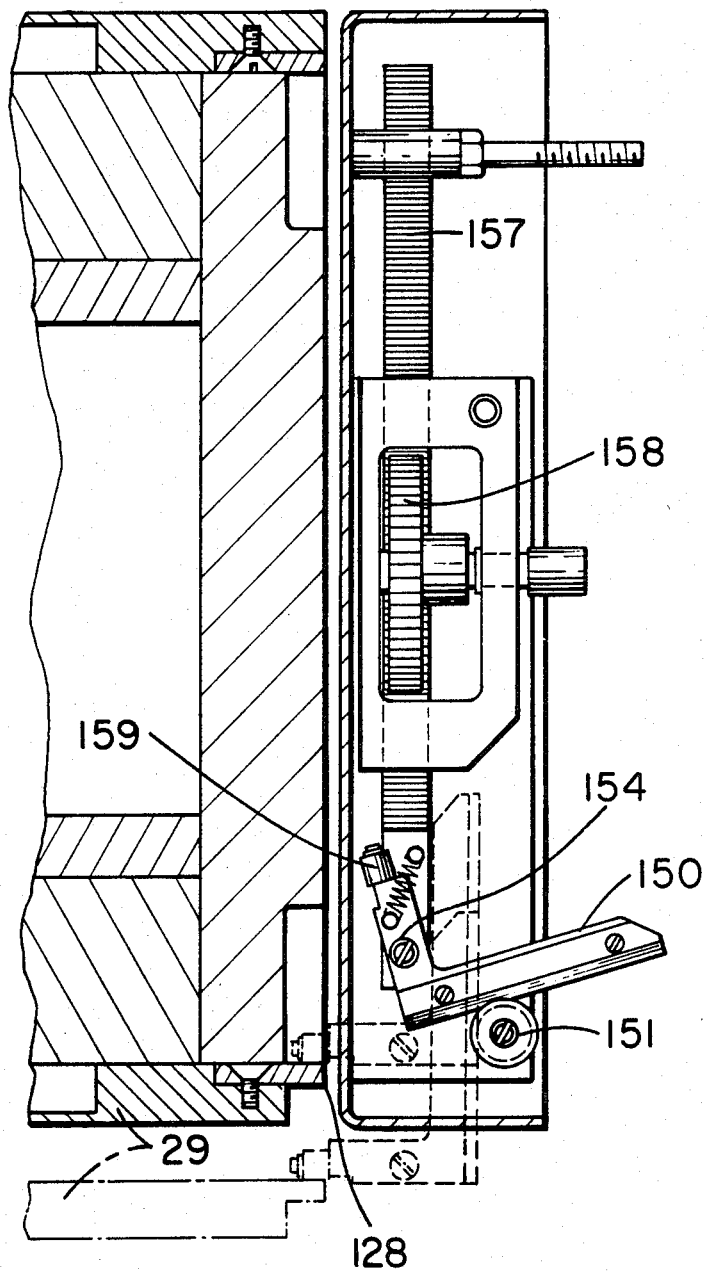
FIG. 16 is a cross sectional view taken along the line 16—16 of FIG. 8.

In FIG. 16 there is illustrated in detail the mechanism for effecting the pivotal motion of the tray elements 29. A crank arm 150 is pivoted at pivot 154 and, as the rack 157 is driven forward by pinion 158, the pivot point is brought forward and the roller 151 forces the crank to rotate to the position shown in phantom in FIG. 16. When the roller 159 on the end of the crank 150 engages the tab 128 it drives the lower edge of the tray element 29 outward. The program controller controls the drive of the pinion 158 such that the rack is driven to a first displaced position with the tray element 29 pivoted out from the face of the electrode structure 18 sufficiently far to allow the paddle support arm 52 to be inserted between the face and the tray element 29 and it can be driven to a still further out pivoted position where the arm 130 will engage the resilient tab elements 122.

The entire hexagonal electrode structure is carried on a pivot bearing and can be rotated by a rotational drive 130a so as to position any selected face of the hexagonso that its disk electrodes lie in vertical alignment above the slit valve 22.

THE SLIT VALVE

Figure 14:
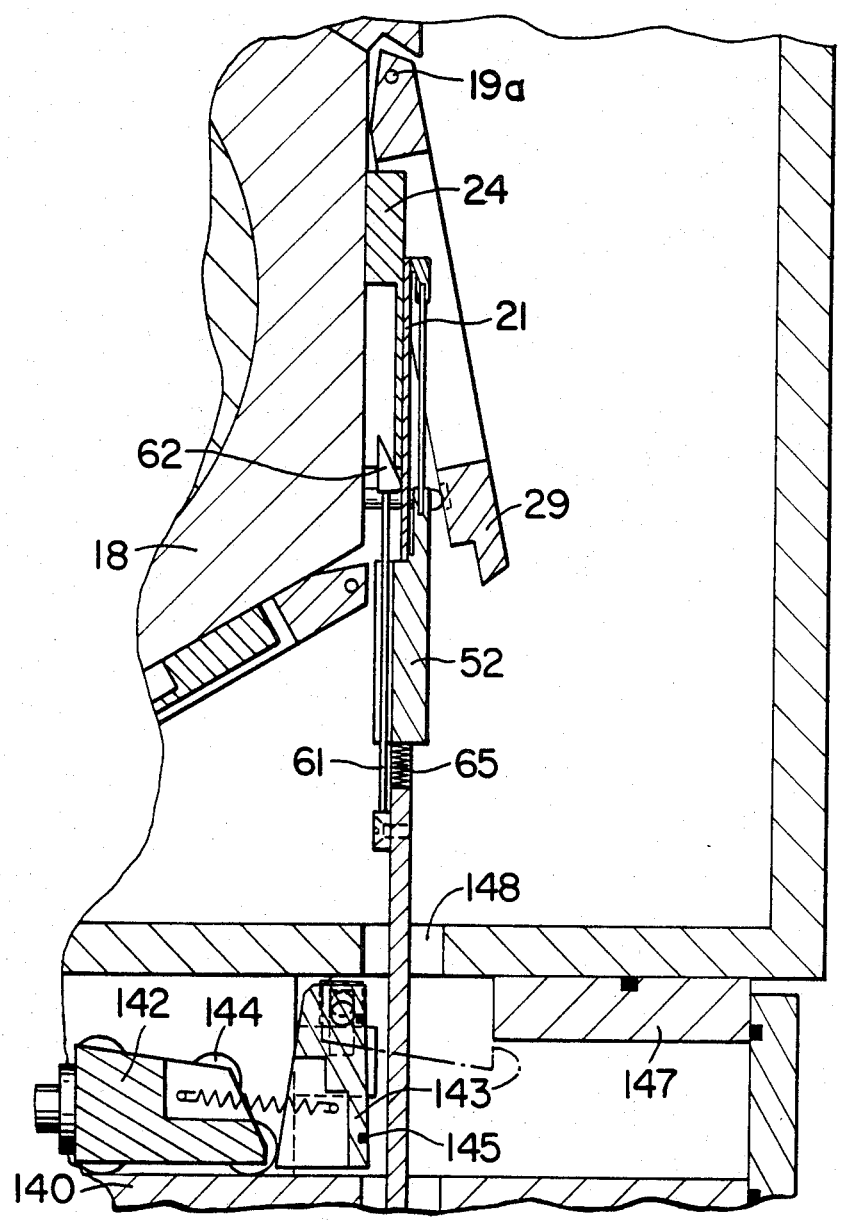
FIG. 14 is a detailed cross sectional view taken along the line 14—14 of FIG. 9 showing the tray element in its intermediate pivoted position.
Figure 15:
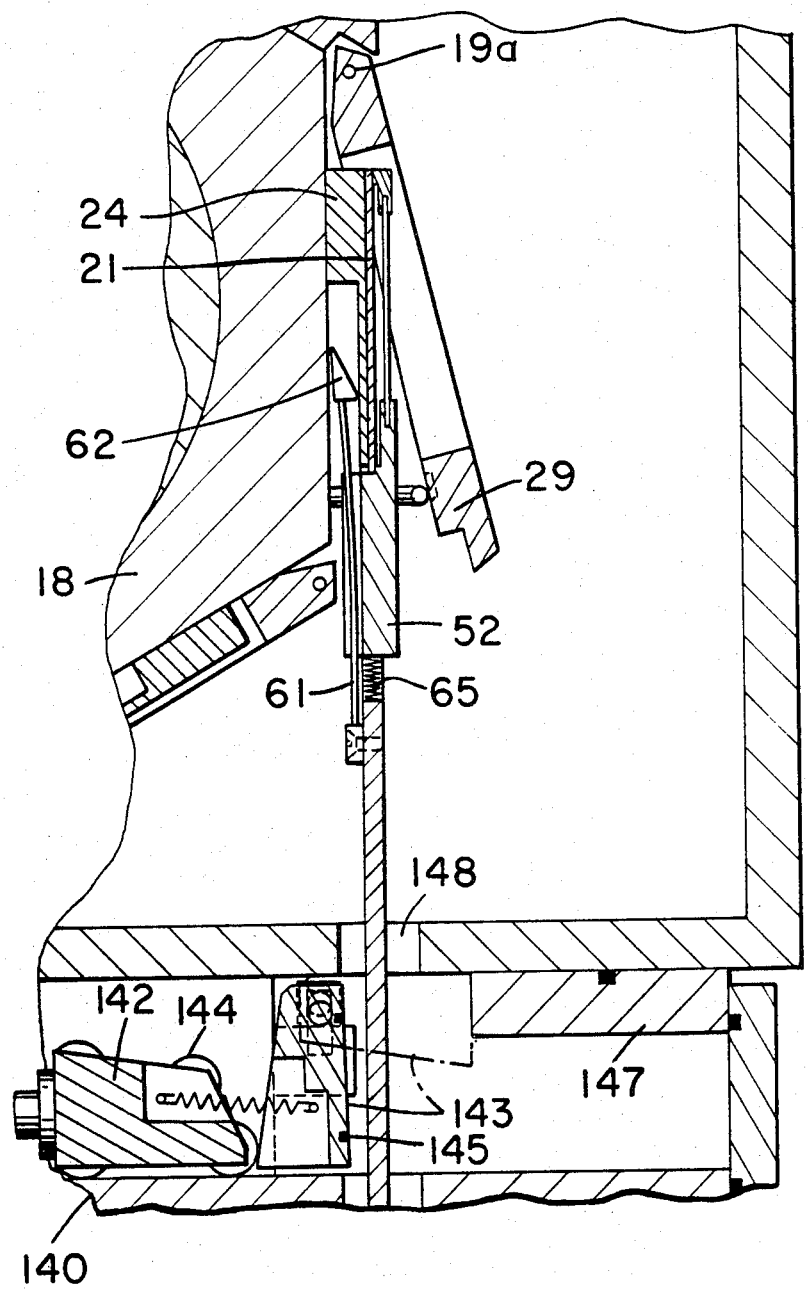
FIG. 15 is the same view as FIG. 14 showing the tray element in its fully pivoted position.

The slit valve 22 is most clearly illustrated in FIGS. 3, 14 and 15. The sealing elements of the valve include an upper block 143 and a linked lower block 142. The lower block 142 has a series of roller bearings 144 permitting it to travel freely along the lower plate 140 of the slit valve assembly and, at the same time, providing rolling contact against the sealing plate 143 when in motion. The lower element 142 is carried on the end of the drive rod 146, which extends from an air cyclinder 150a which is once again operated under the control of the program controller. Thus, on the forward stroke of the cyclinder the roller element 142 is driven across the opening 148 in the slit valve of the reaction chamber until it pivots up the sealing plate 143. The configuration of the lower block 142 of the valve element applies vertical upward pressure against the block 143 causing the gasket 145 carried in that block to effectively seal the opening 148. On the withdrawal stroke, block 143 is lowered somewhat vertically and pivoted down from the opening 148 thereby opening the passage and permitting the support arms 52 to move therethrough.

OPERATION OF THE LOAD MECHANISM

At the commencement of the loading cycle, when the cover 15 for the loading port 51 is opened, both of the blades 80 and 82 are in their lowermost position when the slit valve 22 is closed. The carrier arms 30 then are rotated through the loading port 51, with the semiconductor wafers 21 being retained on them by the vacuum action of the vacuum chucks 31 with the flat on the wafere oriented horizontally on the lower side. As described previously, depending upon the pivoted position of the frame 104, either blade 80 or 82 is then raised such that the recessed edge of the paddle block 52 engages the flat on the semiconductor wafer 21 while the cam tips 62 ride behind the vacuum chucks 31. The intermediate stopping position of the blade elements is such that the wafer is now supported on the paddle with the upper peripheral edge of the wafer resting on the ridge of the support arm cap 58. Upon release of the vacuum, the blade is now withdrawn downwardly to its lowermost position, allowing the cam tips 62 to slip from behind the vacuum chucks 31 and engage the back (non-sensitive) surface of each of the semiconductor wafers. At this point the carriers 30 are withdrawn through the loading port 51 and returned to their original or rest position. The cylinder 49 is then actuated to close the cover 15 of the loading port 51 into a sealed position. A vacuum is then drawn on the loading mechanism assembly housing 13 and, when sufficient time has elapsed for this vacuum to be achieved, the slit valve 22 is opened. The tray element 29 which is in a vertical plane generally aligned with the blade element carrying the semiconductor wafers 21 is now pivoted outwardly to its outermost position and the blade element carrying the semiconductor wafers 21 is driven upwardly to its topmost position in which the semiconductor wafers 21 carried on the support arms 52 are positioned immediately adjacent to and generally concentric with corresponding ones of said disk shaped electrodes. The cam tips 62 on each of the support arms 52 ride behind the electrode faces during this upward movement so that the semiconductors wafers 21 are retained in position only by virtue of their resting on the support arm in close juxtaposition to the disk shaped electrodes 24.

Once this upward position of the blade has been achieved, the tray member 29 is pivoted back to the intermediate position, allowing the resilient tabs 122 to engage the outer rim of the wafers 21 clamping them to the respective disk shaped electrodes 24. At this point the blade carrying the support arm elements is reciprocated downwardly to its lowermost position and, once the support arms have cleared the lower edge of the tray elements 29, the tray element is returned to its closed position in which the additional resilient elements 120 now aid in clamping the semiconductor wafers 21 to the disk shaped electrodes 24. The slit valve 22 is closed and sealed and the reaction chamber 16 may be filled with gas and the process carried out in the usual manner.

In order to provide for more efficient operation both blades may be used during a single portion of the cycle when the housing 13 of the load mechanism assembly is evacuated. In one such arrangement, two of the faces of the hexagon may be loaded with wafers for each such evacuation. The sequence in this operation proceed with the initial transfer of the wafers from the carriers to the support arms in the same fashion as described above. However, once the wafers are mounted on the support arms 52, and the carrier elements 30 are withdrawn to their normal or rest position, the cover 15 of the loading port 51 is not closed. An additional set of four wafers is transported onto each of the carrier arms 30 and, at the same time, the blade element which now carries the semiconductor wafers 21 is withdrawn to its lowermost position and the frame 104 is pivoted to bring the other blade element to position for receiving a transfer of wafer elements. The carriers 30, carrying a second set of semiconductor wafers 21, rotate upwardly into poisiton to align with the support arms carried on the second blade when it is raised and the second blade is raised to receive the second set of semiconductor wafers 21 in the same fashion as the first blade received the first set of four. The second blade is now withdrawn to its lowermost position and the cover 15 of the loading port 51 is closed and sealed.

The loading mechanism housing 13 is now evacuated with both blades carrying a set of four semiconductor wafers within it and the slit valve 22 is opened after this vacuum has been achieved.

The blade carrying the second set of wafers 21 which have just been transferred from the transport system is now raised vertically to its uppermost position, with the tray element 29 being pivoted outwardly to allow transfer of this set of wafers to the corresponding disk shaped electrodes in the same fashion as was described previously. After the transfer has been accomplished and this blade is withdrawn into the housing 13, the slit valve is not closed, but rather the hexagonal electrode structure 18 is rotated to align a new face of the hexagon with the slit valve. Frame 104 carrying the blades 80 and 82 is now pivoted to bring the other blade whose support arms are carrying the other set of semiconductor wafers 21 into alignment with the slit valve and upon raising this blade vertically, the second set of wafers can be transferred to the second face of the hexagon in the same fashion as was the first set. Upon completion of this transfer this second blade is withdrawn into the load mechanism housing 13, and the slit valve is closed. The hexagonal reactor chamber can be operated either such that the process is carried out only after all of the electrode faces have been loaded for the full time required for the plasma processing, or if only one face is loaded for each cycle, one-sixth of the process can be carried out and the load/unload mechanism can be actuated. Still another alternative with the system described herein would be to load two faces of the electrode structure at a time and process for one-third of the total process time before again actuating the load mechanism. Since the general purpose is to provide for a continuous or semicontinuous processing, it is preferred to have the semiconductor wafers which have completed their processing be withdrawn in the unloading cycle while a new set of unprocessed wafers is transferred onto that face without requiring an additional evacuation cycle of the load mechanism housing. One way of accomplishing this is to provide that one of the blades withdraws the already processed semiconductor wafers from a hexagonal face and the other blade carries new unprocessed wafers and transfers them onto the same face.

While there has been no specific description of the program control for operating the device in any of the various sequences described, it will be understood that there are a number of suitable program controllers. If a fixed sequence is desired, the program controller can consist of a series of cam operated electrical switches to actuate the various pistons and motors in appropriate sequence as described above. More flexible programs can be carried out by using a computer with appropriate software to provide electrical signals to actuate the appropriate electric motors and pistons. Of course, the hydraulic or pneumatic pistons can be controlled by electrically operated valves responing to these electrical signals.

As indicated, the preferred form of controller is a programmed digital computer system. In the present exemplary embodiment, the digital computer system includes a BAL11ME backplane and power supply, a PDP11/23 digital computer board, a MSV11L memory board, three DLV11J parallel input/output boards and a DLV11J serial line interface for a CRT terminal, all manufactured by Digital Equipment Corporation, Maynard, Mass., and a Visual100 CRT terminal, manufactured by Visual Technology, Inc., Tewksbury, Mass. The program, implemented in Pascal, for the exemplary digital computer system is shown in Appendix A. In other embodiments, different computer configurations may be used, as well as different programs, to control the functional operation of the system as described above.

FIGS. 17-27 show features of a second embodiment of the system. In the second embodiment, elements of the loading mechanism 13 and the hexagonal electrode assembly 18 have been modified to eliminate or minimize cavities or recesses in the reaction chamber 12. Such cavities and recesses may under some circumstances accumulate gas plasma and lead to arcing during high energy operation of the chamber.

Figure 8:
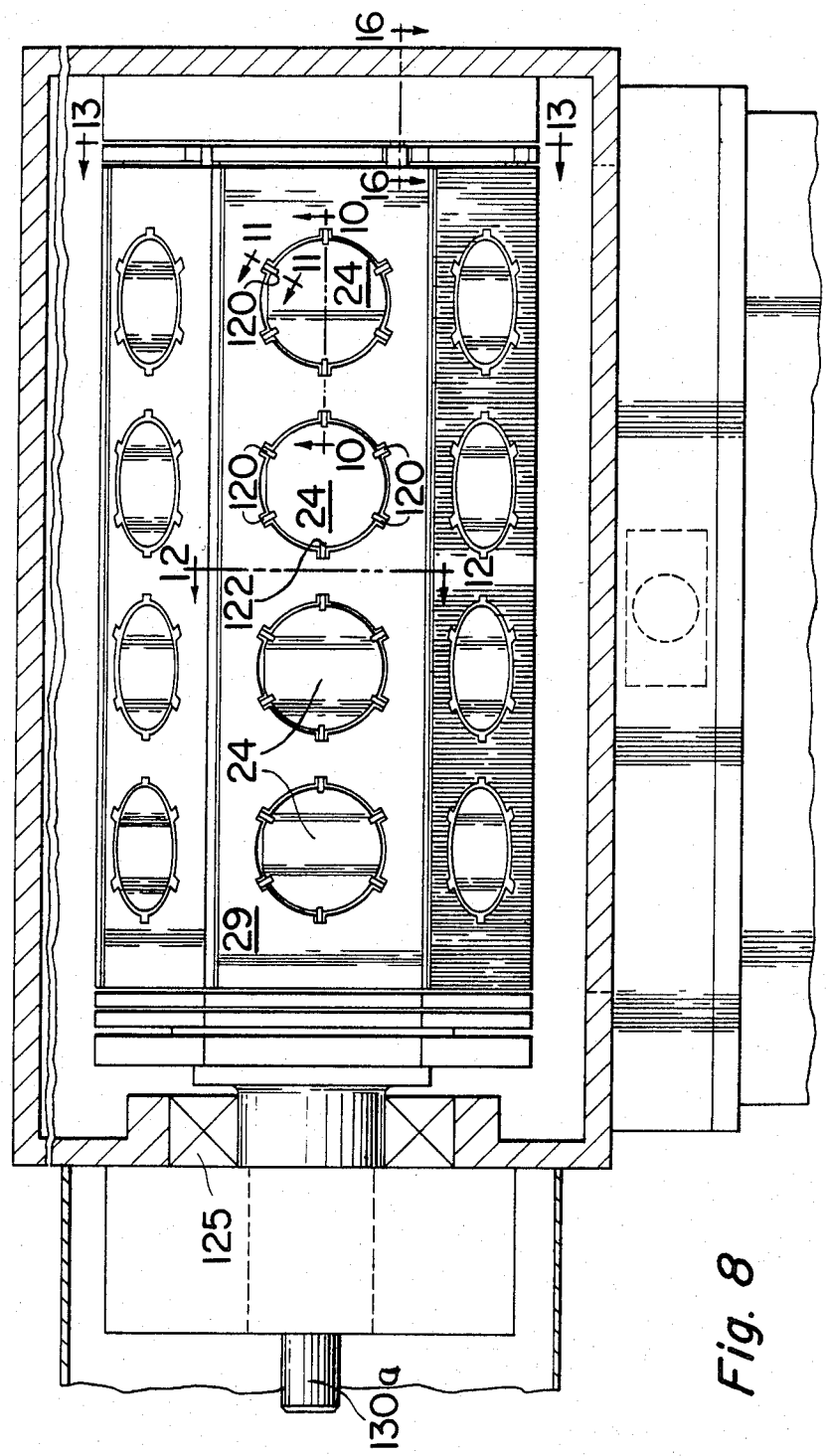
FIG. 8 is a cross sectional view of a hexagonal electrode structure along line 8—8 of FIG. 1.
Figure 9:
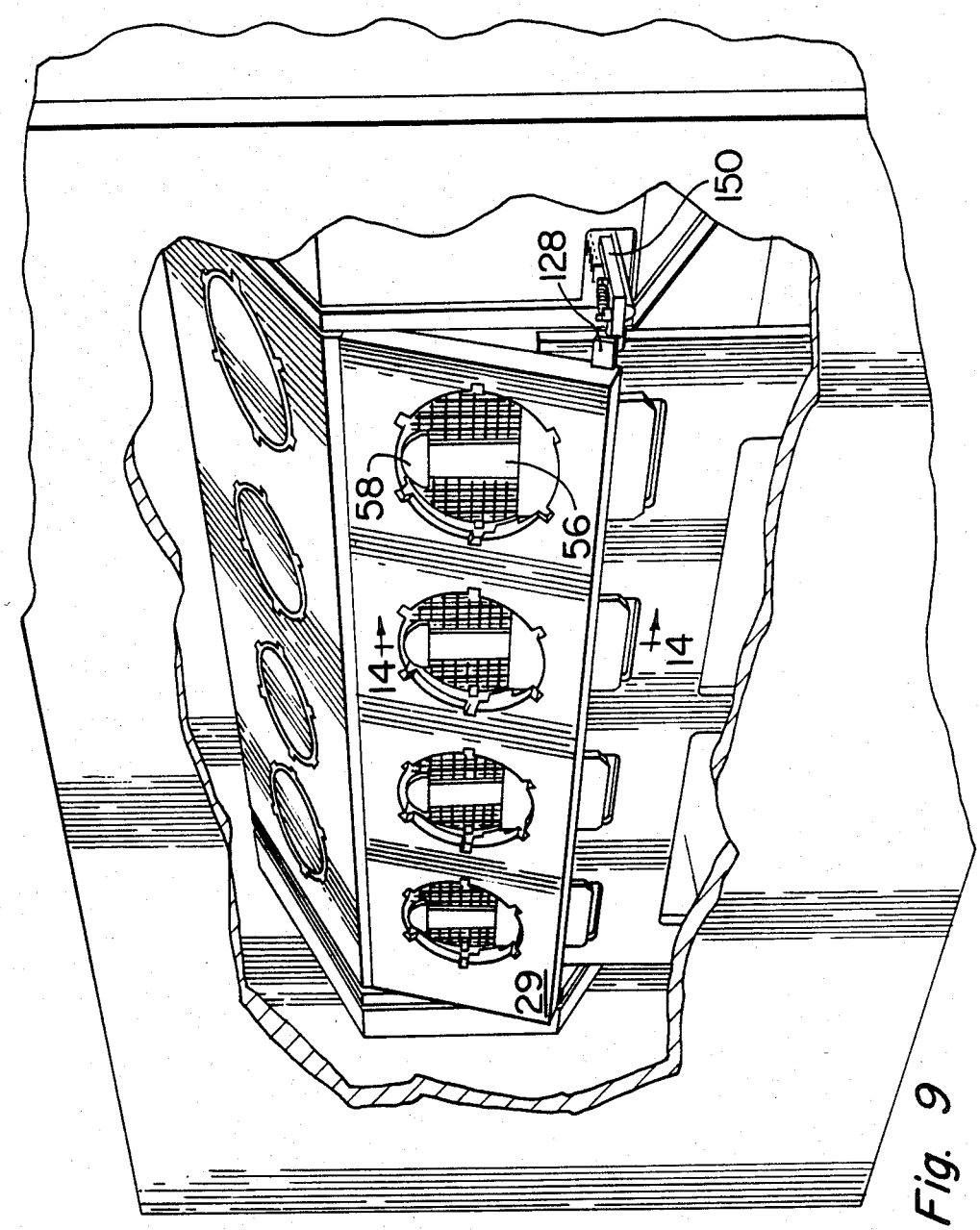
FIG. 9 is an illustration in perspective view of the hexagonal electrode structure of FIG. 1 during the intermediate steps of loading operation.
Figure 10:
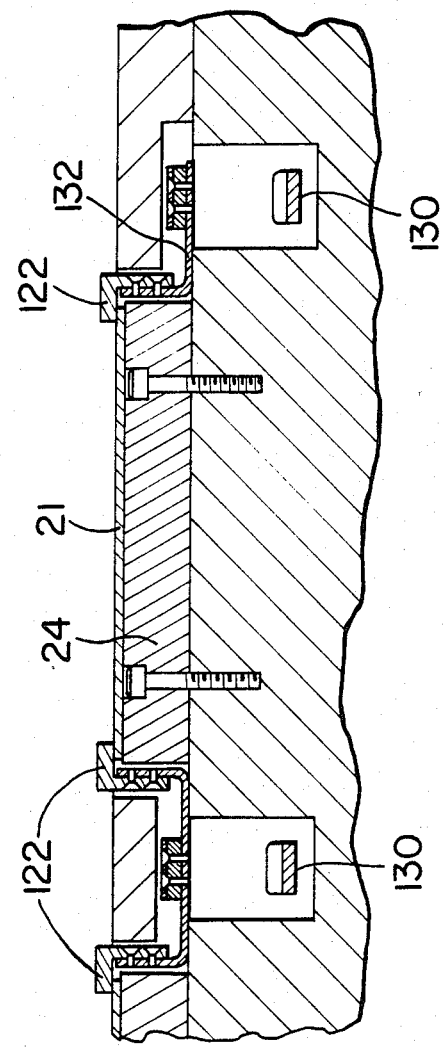
FIG. 10 is an illustration in cross sectional view taken along the line 10—10 of FIG. 8.
Figures 11, 12:
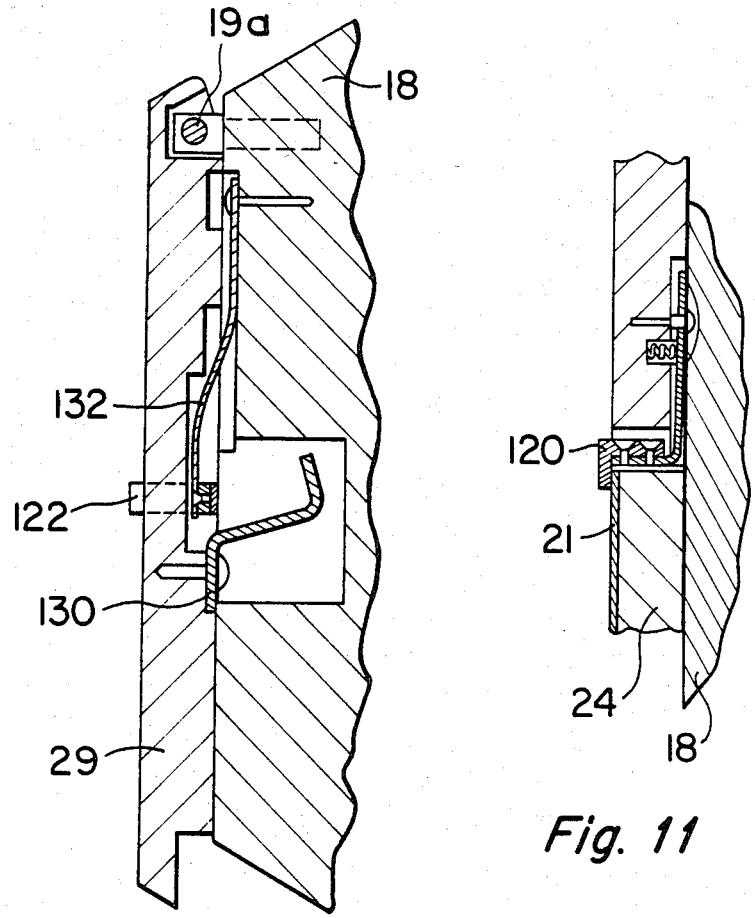
FIG. 11 is an illustration in cross sectional view taken along the line 11—11 of FIG. 8.
FIG. 12 is a cross sectional view taken along the line 12—12 of FIG. 8.
Figure 13:
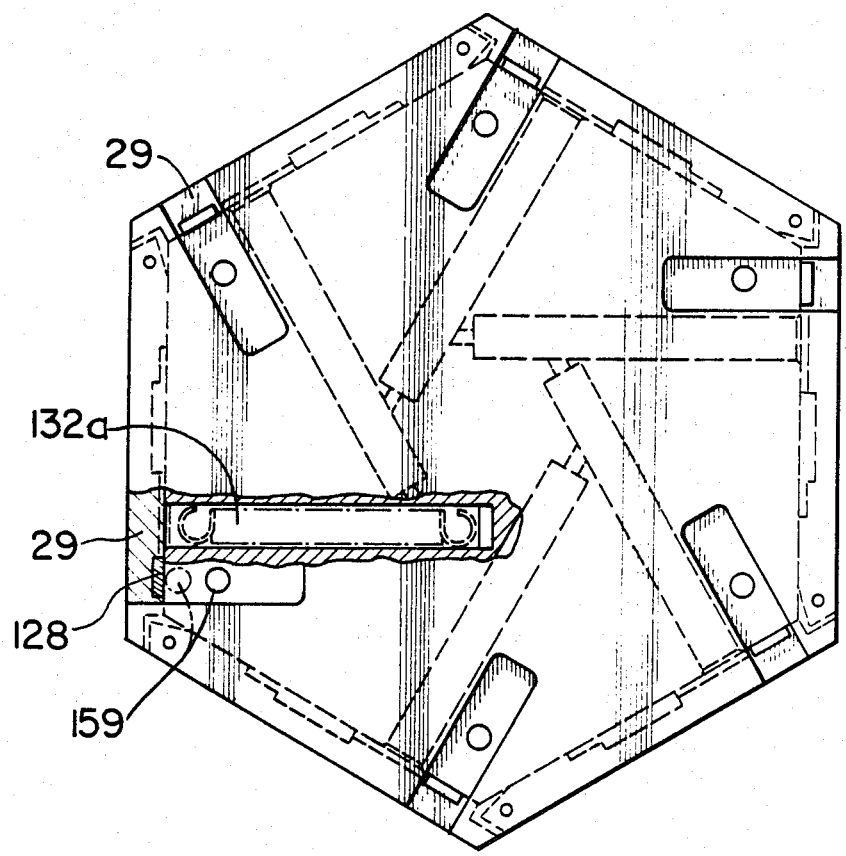
FIG. 13 is a cross sectional view of the hexagonal electrode assembly taken along the line 13—13 of FIG. 8.
Figure 17:
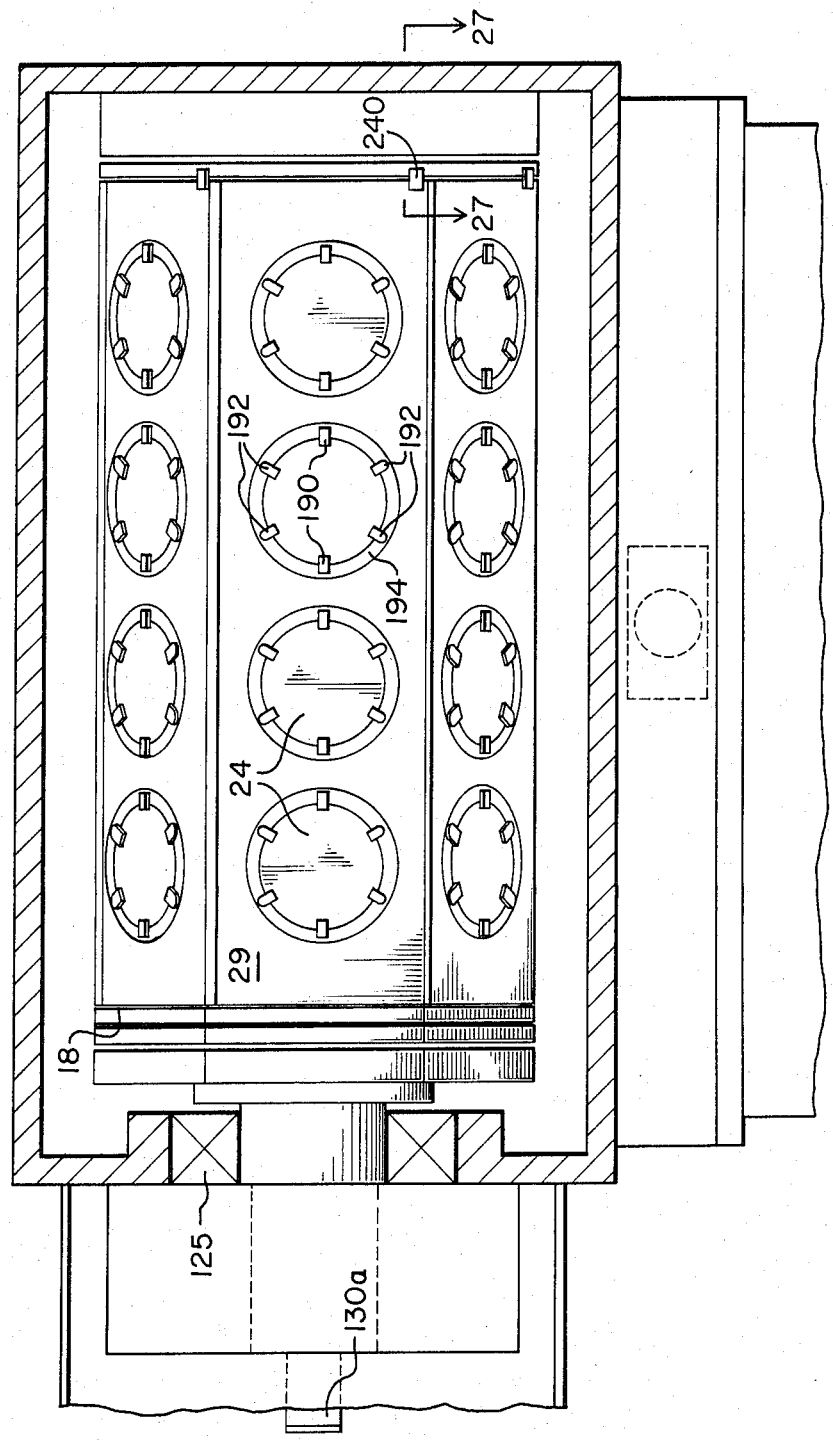
FIG. 17 is a cross sectional view (like that of FIG. 8) of a hexagonal electrode structure of a second embodiment of the invention.

FIG. 17 is a view like that of FIG. 8, showing the electrode assembly 18. The same reference numerals will be used in the description and drawings of the second embodiment as in the first for elements that are common to both embodiments. Thus, FIG. 17 shows an electrode structure formed of a rotatable frame 18 that is hexagonal, and that has a series of disk shaped electrodes 24 on each face of the hexagon and a rectangular tray 29 hingedly connected to each face of the hexagon. The tray 29 is swingable between a first position in close parallel contact with each hexagon face and two other positions each angularly displaced from the first poisiton (and angularly displaced from each other).

As explained in the description of the first embodiment, the movement of the tray 29 between these positions occurs in conjunction with movement of the paddles 52 mounted on vertically movable blades 80,82 of the load mechanism to capture wafers from or release them to the paddles 52.

Figure 18:
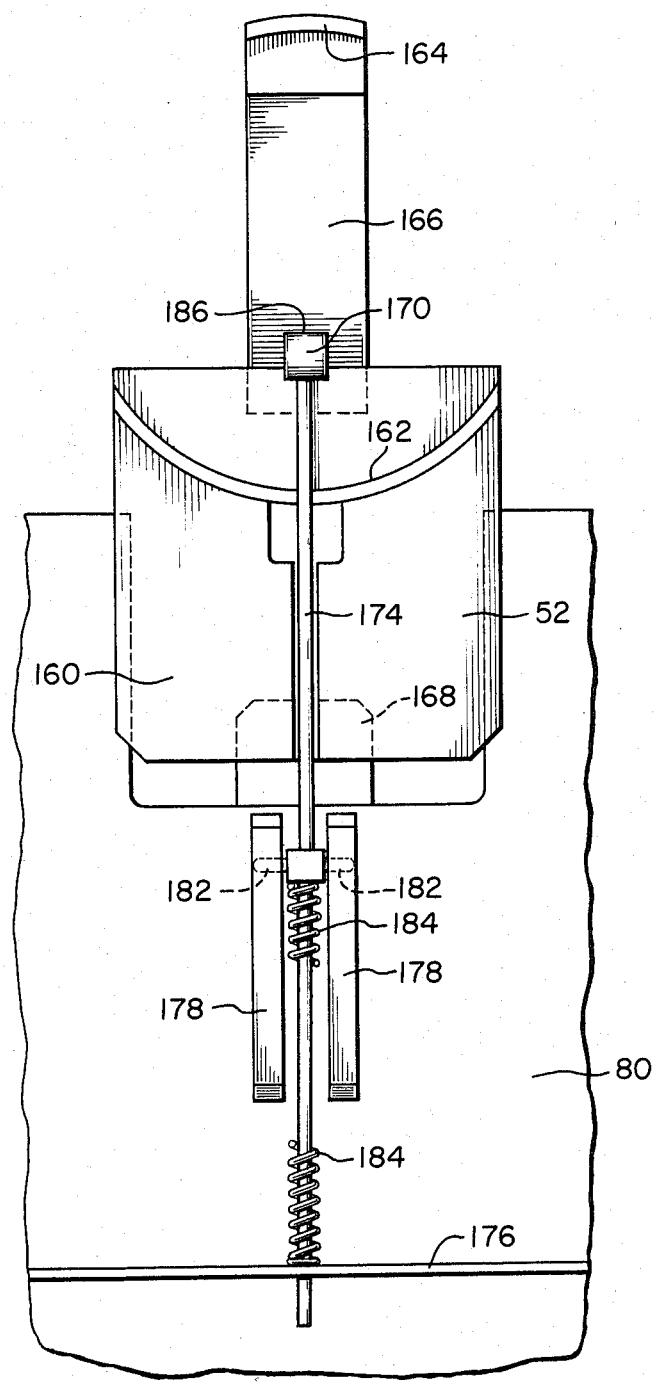
FIG. 18 is an elevation view of a wafer paddle of a second embodiment of the invention.
Figure 19:
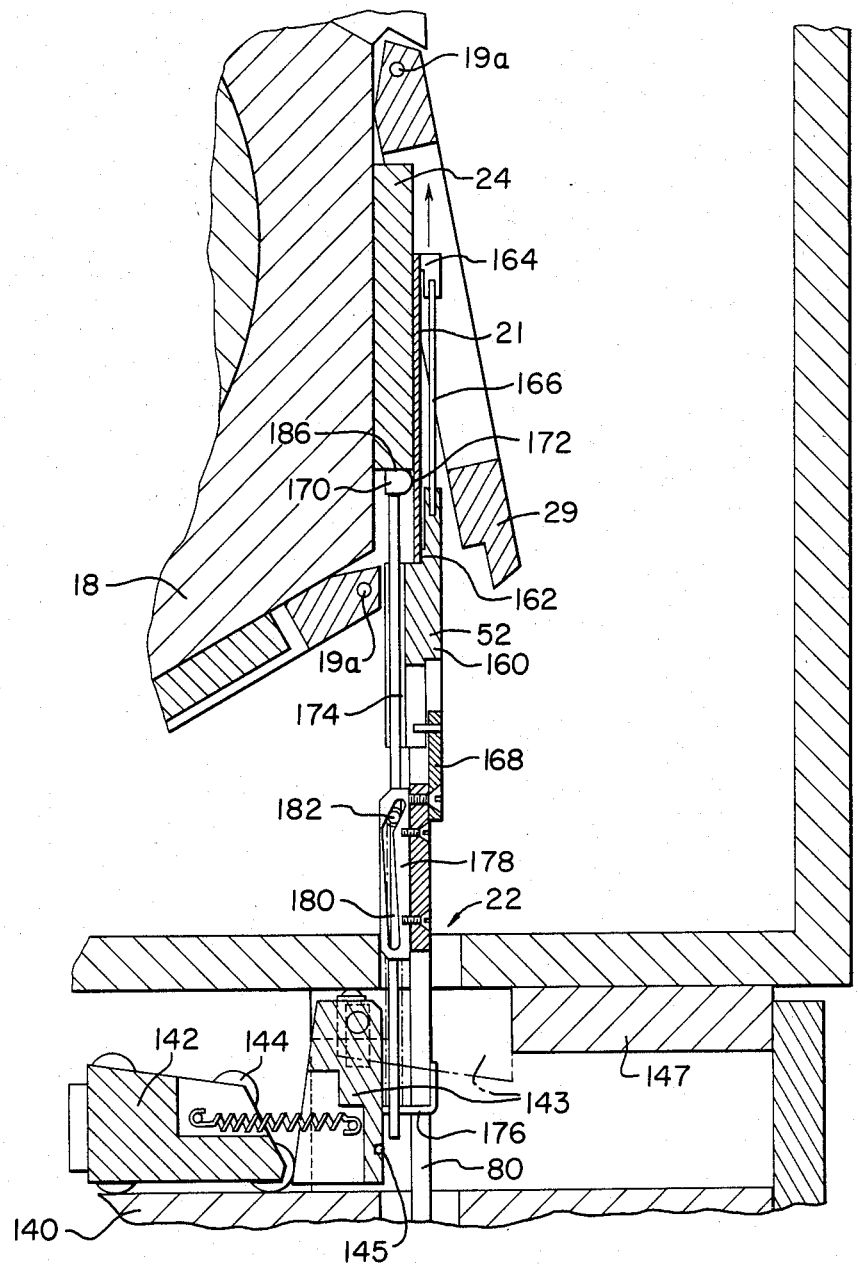
FIG. 19 is a sectional view of the wafer paddle of FIG. 18 bearing a wafer, beginning to engage an electrode pedestal of the hexagonal electrode structure of FIG. 17.

FIGS. 18 and 19 show a paddle 52 of the second embodiment, mounted on one of the vertically reciprocating blades 80. The paddle 52 includes a lower main section 160 with a curved stepped groove 162 for receiving and supporting the bottom of a wafer 21, and an upper retaining top 164 against which the top of a wafer 21 may rest. The retaining top 164 is connected to the lower main section 160 by a flat metal spring element 166. The lower main section 160 is fastened to a connecting block 168 which in turn is screwed onto the blade 80.

The paddle 52 of this second embodiment shown in FIGS. 18 and 19 includes a vertically retractable pawl 170. The pawl 170, made out of a polymer sold by Union Carbide Corp. under the trademark "Delrin," has a curved front surface 172 for contacting the wafer 21 and holding it in place while the paddle 52 transfers it to and from the gas reaction chamber 12 (see FIGS. 19 and 20).

The pawl 170 is fixed atop a stainless steel rod 174 whose lower portion is slidable through a hole in a bracket 176 fixed to the blade 80. Intermediate the pawl 170 and the bracket 176 are a pair of cam guides 178, made also from Delrin material, and positioned on either side of the rod 174. The cam guides 178 define cam slots 180 into which extends a transverse axle 182 on the rod 174. A coil spring 184 surrounds the rod 174 and extends between the axle 182 and the pawl bracket 176. The cam slots 180 in the cam guides 178 are arranged so that as the pawl 170 is forced downward against the bias of spring 184, the axle 182 travelling in the cam slots 180 causes the pawl 170 to move transversely away from, as well as downward from, its position against a wafer 21. The pawl 170 is forced downward when its upper surface 186 meets an object during upward travel of the blade 80. Such an event occurs when the paddle 52 rises on the blade 80 (or blade 82) to meet a wafer 21 on a vacuum chuck 31, when the pawl upper surface 186 meets the bottom of the vacuum chuck 31 (see FIGS. 2 and 3). It also occurs during transfer of the wafer 21 from the paddle 52 to the electrodes 24 within the plasma reaction chamber 12.

Figure 20:
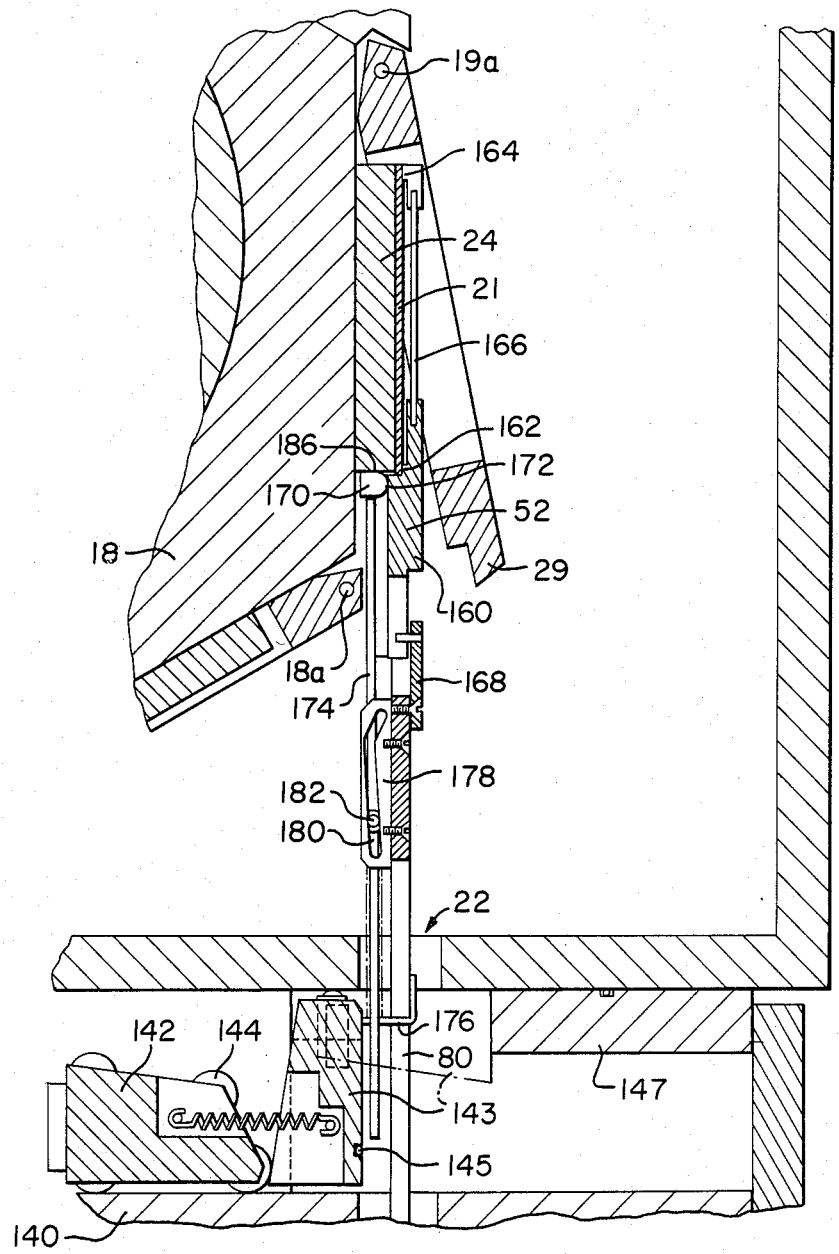
FIG. 20 is a view like that of FIG. 19 in which the wafer has fully engaged the electrode pedestal and the wafer paddle has begun to disengage from the wafer.

The transfer of a wafer 21 from the paddle 52 to the electrodes 24 is illustrated in FIGS. 19 and 20. FIG. 19 shows a wafer 21, carried through the slit valve 22 by the paddle 52, in the direction of the arrow, beginning to engage an electrode 24. The pawl 170, which has been seating the wafer 21 against the paddle top 164 and paddle groove 162, meets the bottom of the electrode 24. As the blade 80 continues to proceed upward in the direction of the arrow the pawl 170 moves transversely away from, and downwardly from, contact with the wafer 21 (see FIG. 20).

With the pawl 170 of this second embodiment moving downward from the wafer 21, there is no need for a recess behind the face of the electrode 24, as there is in the first embodiment (see FIGS. 14 and 15), where such a recess is necessary to accommodate the paddle clips 62 of the paddle 52 of the first embodiment.

As shown in FIG. 20, the pivotable tray 29 of the electrode assembly 18 is still in its outermost position, which it takes while a wafer 21 is brought to the electrode assembly 18. As in the first embodiment, the next step is for the tray 29 to move to an intermediate position, where a pair of intermediate holding tabs 190 engage the wafer 21 and press it against the face of an electrode 24 while the paddle 52 is retracted. Then the tray 29 moves, in accordance with the programmed movements of the system, to a fully closed position, where four additional tabs, full engagement tabs 192, press the wafer 21 against the electrode face.

Figure 21:
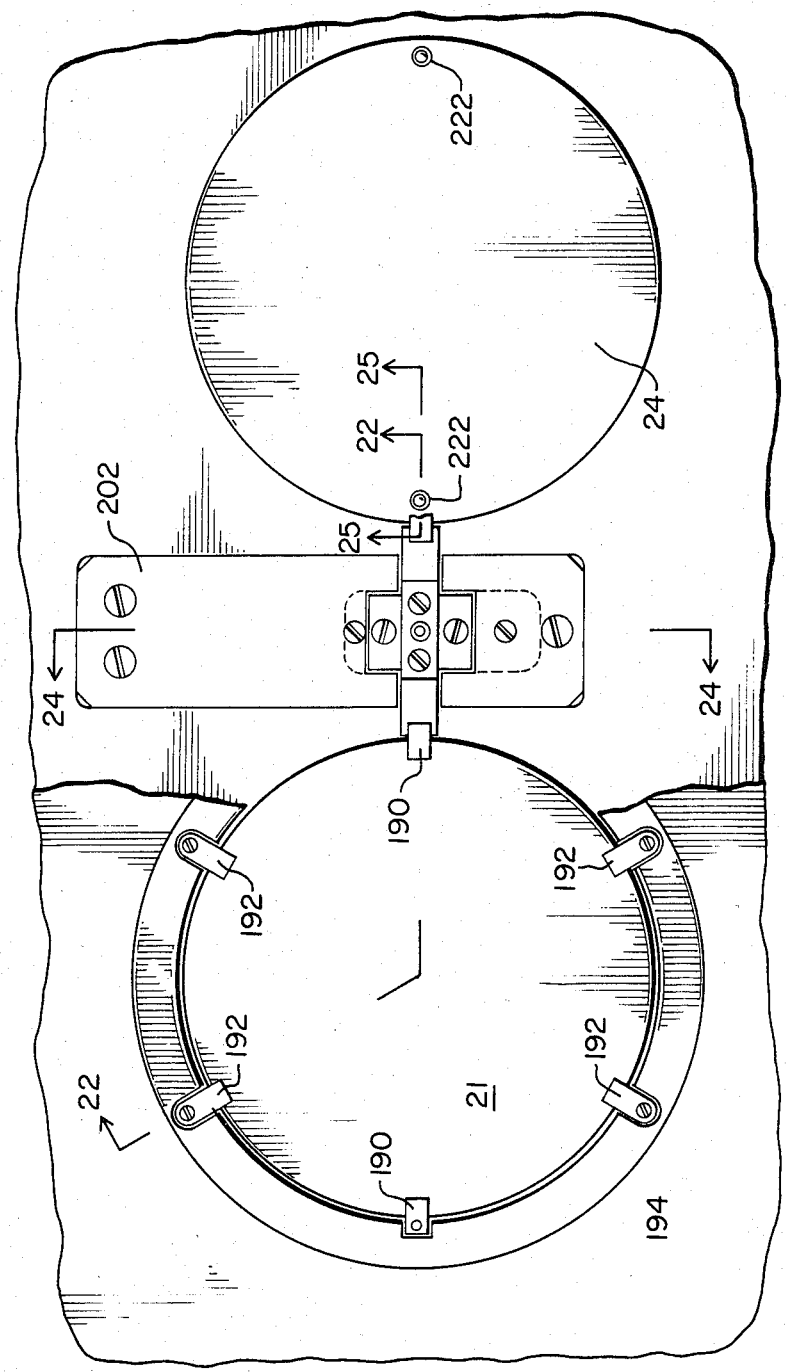
FIG. 21 is a detailed view of a closed tray of the hexagonal electrode of FIG. 17, in which the tray is partially cut away to show the electrodes and electrode support structure.

In the second embodiment of the invention, as shown in FIGS. 17 and 21, the four full engagement tabs 192 are seated in a ring 194 of "Ardel" material, rather than directly in the tray 29. Each ring 194 is seated in a groove surrounding each opening of the tray 29, so that the general relationship of the full engagement tabs 192 to the remainder of the electrode assembly 18 is the same as in the first embodiment.

As shown in FIG. 22, the tabs 192 are fixed to the ends of shoulder screws 196 made from "Ardel" material that are spring loaded in recesses 198 formed in the ring 194. The recesses 198 are small and open to a side of the ring 194 that is pressed against the electrode assembly structure during operation of the gas reaction chamber. The shoulder screws 196 extend through holes 200 in the bottom of the recesses 198 to thread into the tabs 192.

Figure 24:
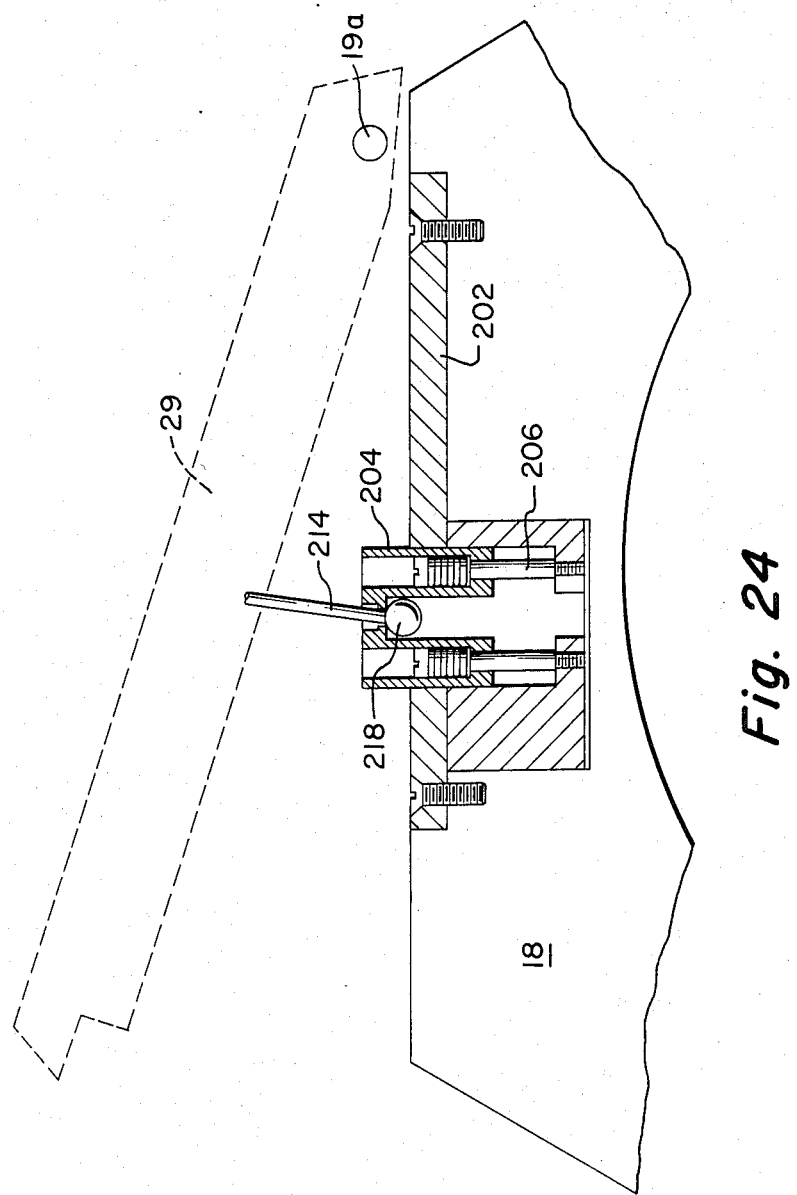
FIG. 24 is a sectional view along the line 24—24 of FIG. 21, showing the tray in its fully open position.

As shown in FIGS. 21-24, the second embodiment has a different arrangement and configuration of the structure supporting the intermediate holding tabs 190. FIG. 21 shows the tabs 190 in a mounting 202 embedded in the electrode assembly 18. FIG. 22 shows the intermediate holding tab 190 arrangement from a view looking up, and showing the tabs 190. FIG. 23 is a similar view, with the tray 29 lifted to its intermediate position. FIG. 24 is another view of the tab arrangement, but from a direction 90° changed from FIGS. 22 and 23, and also with the tray 29 lifted to its fully open position. FIG. 24 shows more clearly the spring loading arrangement of the intermediate tab assembly.

As seen in FIGS. 21-24, the intermediate holding tabs 190 comprise lateral extensions from a tab block 204 seated in the mounting 202. The tab block 204 is resiliently seated in the mounting 202 by way of spring loaded screws 206, so that the tabs 190 are biased toward the electrode assembly 18. The tab block 204 defines an axial bore 208 with a narrow upper portion 210 and a lower bottom portion 212.

A linkage rod 214, with a ball 216,218 fixed at each end, connects the hexagon electrode assembly tray 29 to the intermediate tab block 204. The ball 216 at one end of the rod 214 is seated in the tray 29. The ball 218 at the other end is movable in the block bore bottom portion 212, the rod 214 extending through the bore upper portion 210.

When the tray 29 is in its fully closed position the ball 218 at the end of rod 214 is located at the very bottom of bore portion 212 (see FIG. 22). When the tray 29 moves to its intermediate open position (see FIG. 23) the ball 218 travels up the bore portion 212 to a ball seat 220, as the linkage rod 214 travels up the bore 208. In this situation, the intermediate holding tabs 190 still are resiliently holding the wafer 21 to the face of an electrode 24. When the tray 29 moves to its outermost open position (see FIG. 24) the ball 218 engages the ball seat 220 of the block 204 and pulls the block 204 including the tabs 190 up and out of the mounting 202, disengaging the tabs 190 from the wafer 21.

In a wafer loading operation, the steps would be reversed. That is, the tray 29 would be fully open while a wafer 21 is brought to the face of the electrode 24, and neither the full engagement tabs 192, nor the intermediate engagement tabs 190 engage the wafer 21. When the tray 29 moves to its intermediate position (FIG. 23), the intermediate tabs 190 engage the wafer 21. Then the paddle 52 which brought the wafer 21 up is retracted, and the tray 29 move to its fully closed position. Then the full engagement tabs 192 also engage the wafer 21, the intermediate tabs 190 continuing to engage the wafer 21 as well.

Figure 25:
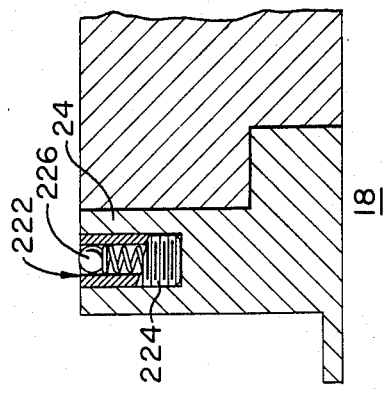
FIG. 25 is a sectional view, along the line 25—25, of the electrode of FIG. 21, showing a spring loaded ball plunger seated in one of the electrodes.
Figure 26:
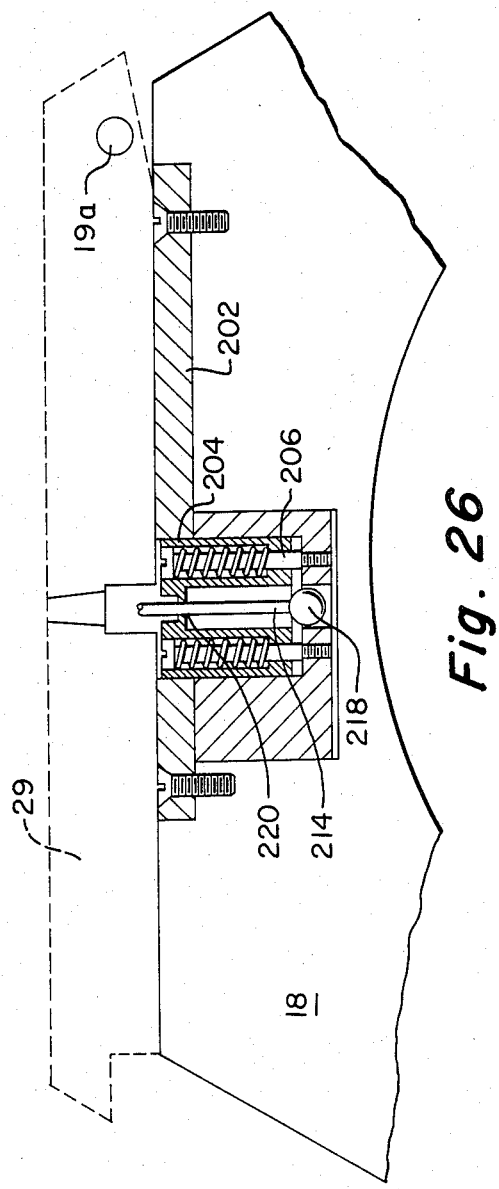
FIG. 26 is a sectional view, along the line 26—26 of FIG. 21, showing the intermediate holding tab assembly of the hexagon assembly.

FIG. 25 shows a spring loaded ball plunger 222 screwed into a threaded hole 224 in the face of an electrode 24 approximately beneath the positions of the intermediate holding tabs 192. The ball 226 of the plunger 222 is resiliently urged against a wafer 21 placed on the electrode face to positively urge the wafer 21 off the electrode face when the intermediate holding tabs 192 are disengaged. The balls 226 also enhance the gripping of the wafers 21 when the intermediate holding tabs 192 are engaged with the wafer 21 because the balls 226 push the wafers 21 from the opposite side.

Figure 27:
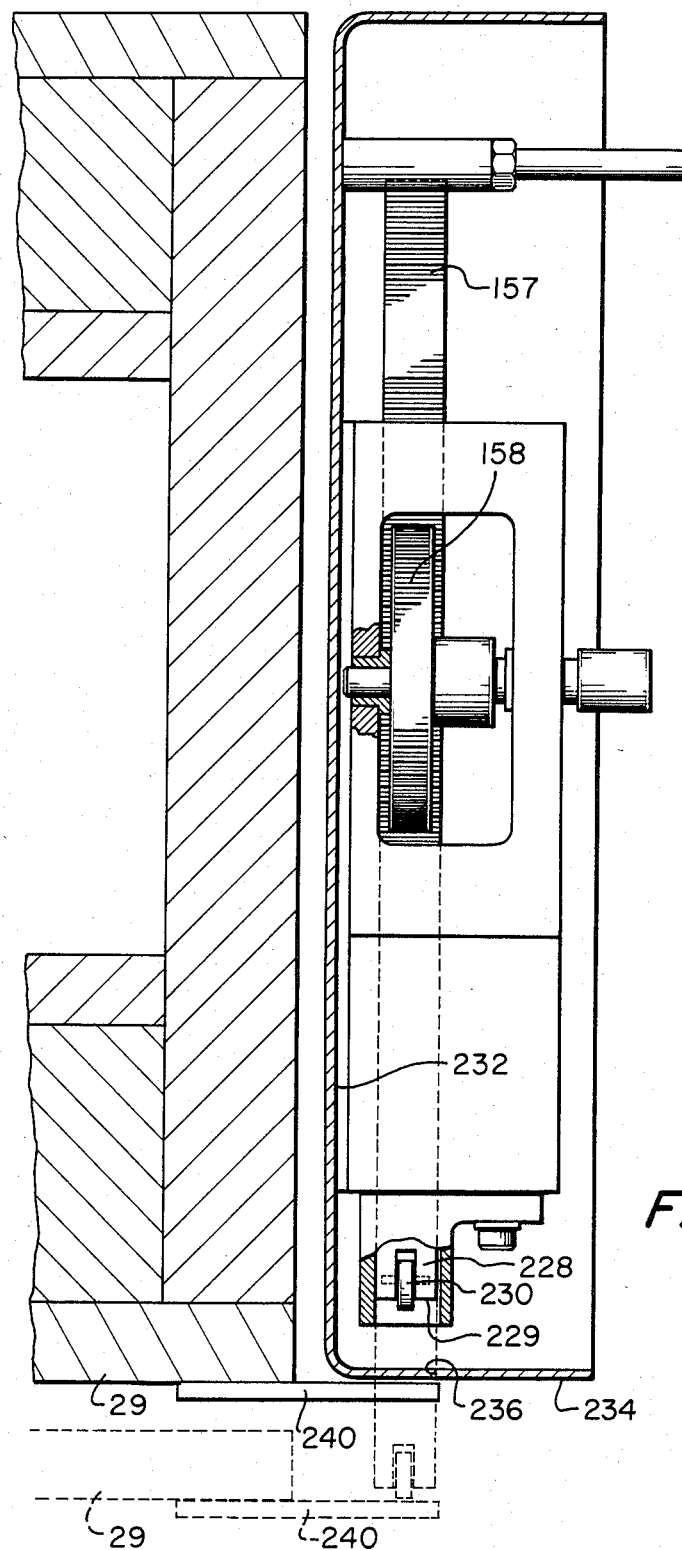
FIG. 27 is a sectional view of the mechanism for opening the tray of the electrode assembly, along the lne 27—27 of FIG. 17.

FIG. 27 shows in detail the mechanism of the second embodiment for effecting the pivotal motion of the trays 29. As in the first embodiment, the mechanism includes a gear rack 157 and pinion 158. The gear rack 157 has a forward push rod portion 228 on which is mounted at the very end 229 a small wheel 230. The mechanism is housed in a dark space shield 232 that has a forward wall portion 234. The push rod 228 is drivable by the pinion 158 (under the control of the program controller) through a close fitting hole 236 in the forward wall portion 234.

When the tray 29 is closed, the push rod 228 is retracted such that the end 229 of the push rod 228 is flush with the outside surface 238, thereby providing an essentially cavity-free surface.

To open the tray 29, the push rod 228 is driven out of the dark space shield 232 to contact and push a tray tab 240 mounted on the outside of the tray 29, and extending approximately one inch beyond the end of the electrode assembly 18. The tab 240 thus extends directly over the location where the push rod 228 exits the dark space shield 232 so that no clearance slots need to be machined into the end of the electrode assembly 18 as in the first embodiment.

As the push rod 228 contacts and pushes the tray tab 240 (with the wheel 230 at the end of the push rod 228) it causes the tray 29 to swing outward toward the tray's intermediate and final open positions. To close the tray 29, the push rod 228 is retracted into the dark space shield 232, and the tray 29 returns to its closed position.

The use of "Ardel" material for the elements of the system, as a coating, or as the material for a complete element, such as the ring 194, is to minimize arcing when the reaction process is carried out. For oxide etching, "Ardel" is generally used to coat the electrodes and any other exposed parts that will be at RF potential during the process. In aluminum etching, "Ardel" may be used only for items such as the tabs. Where an insulating coating is needed, aluminum oxide may be used. The ring 194, fully composed of "Ardel" in the embodiment shown, may, if the operation of the system proceeds successfully with the substitution, be replaced by a metal ring, with an "Ardel" coating or an "Ardel" gasket.

Having described the invention various other modifications and improvements may occur to those skilled in the art and the invention is defined by the following claims.

I claim:

1. A gas plasma reaction system for processing semiconductor wafers comprising,
    a plasma reactor chamber having a centrally located electrode structure formed of a series of longitudinally extended faces, each of said faces being positioned so that in cross-section the electrode structure has a regular polygonal shape, the faces being extended in a horizontal direction, each of said faces having on its surface a plurality of planar disk shaped electrodes for carrying said semiconductor wafers to undergo the plasma reaction during operation, each of said faces being covered by a generally flat tray member having circular openings therein corresponding to the positions of said electrode disks, each of said trays being hinged for pivotal motion from a first position in close parallel juxtaposition with said electrode face to a second position angularly displaced therefrom,
    a loading mechanism disposed generally beneath said reaction chamber, said loading mechanism including a plurality of vertically extending support arms, each of said support arms being configured to carry a semiconductor wafer and formed such that the reactive surface of said semiconductor wafer is not touched by any portion of said vertically extending arm, the number of said vertically extending arms being at least equal to the number of said electrode disks on a single face of said reactor electrode structure,
    means for imparting motion to said arms for moving said arms from a position beneath said reactor chamber to a position within said reactor chamber such that each arm is in close juxtaposition to a corresponding one of said disk electrodes, and for thereafter withdrawing said arm from said position in close juxtaposition back to a position beneath said reactor chamber, and
    control means for controlling the timing of said load mechanism motion such that said arms are moved into and away from close juxtaposition to said disk electrodes only when said tray members are in said second angularly displaced position.

2. A system in accordance with claim 1 and further including a plurality of resilient members mounted around the periphery of each of the circular openings in said tray elements, said resilient members being formed such that when said tray element is in said first position said resilient members clamp a semiconductor wafer to said disk shaped electrode and when said tray member is in said second position said resilient members are not clamping said semiconductor wafers to said disk shaped electrodes.

3. A system in accordance with claim 1 wherein said tray member has a third position in which it is angularly displaced from said first position by an amount less than the angular displacement of said second position and wherein said tray member includes a plurality of resilient elements distributed around the periphery of each of said circular openings, said plurality of resilient elements being formed such that when said tray element is in said first position they can secure a semiconductor wafer to the corresponding disk shaped electrode and when said tray element is in said third position, said resilient elements are disengaged from said semiconductor wafer,
    said electrode faces including at least two additional resilient members mounted thereon such that when said tray element is in said third position, said additional resilient members can retain a semiconductor wafer in position on said disk shaped electrode and when said tray element is in said second position, said additional resilient elements release said semiconductor wafer from its position on said disk shaped electrode,
    said control means operating said vertical arm such that said tray element is moved to said second position and thereafter said arms are moved vertically into close juxtaposition with a corresponding one of said disk shaped electrodes such that each semiconductor wafer carried on each of said arms is positioned on and generally concentric with a corresponding one of said disk shaped electrodes, and thereafter said tray element is moved to said third position, such that said resilient members mounted on said electrode face retain the semiconductor wafer carried by the corresponding vertical arm onto said disk shaped electrode, said control means operating while said tray element is in said third position to cause said reciprocating means to withdraw said arms from within said reaction chamber to a position beneath said reaction chamber and to cause said tray element to move to said first position after said vertical arms have withdrawn to a position below said electrode face.

4. A system in accordance with claim 3 wherein said control means operates said vertical arms and said tray elements during an unloading cycle in a sequence such that said tray element moves from said first position to said third position, thereafter said vertical arms are reciprocated into position to accept said semiconductor wafers from a corresponding one of said disk shaped electrodes, and then said tray element is moved to said second position to release said semiconductor wafers from said disk shaped electrodes, then said vertical arms are reciprocated to a position beneath and outside of said reaction chamber.

5. A system in accordance with claim 1 wherein said load mechanism comprises a pair of blade elements mounted within said housing positioned beneath said reaction chamber, means for imparting reciprocating vertical movement to said blades, and wherein said vertical arms consist of a first group, equal in number to the number of disk shaped electrodes on each face of said electrode structure, and a second group equal in number to said first group, said first group being mounted on a first one of said blades, and said second group being mounted on the second one of said blades, and means for imparting pivotal movement to said blades such that in a first pivoted position the first group of vertical arms are positioned so that upon reciprocating movement they are carried into close juxtaposition with said disk shaped electrodes and in a second pivoted position, said second group of vertical arms are positioned such that upon reciprocating upward movement they are carried into close juxtaposition with said disk shaped electrodes, said control means being operated such that one group of vertical arms carries semiconductor wafers from said transport mechanism into position on said disk shaped electrode when said blades are in one pivoted position and the other group of vertical arms carries semiconductor wafers from said disk shaped electrodes, when said blades are in said second pivoted position.

6. A system in accordance with claim 1 wherein said vertical support arms are each formed of a support strut and a spring clip positioned to hold a semiconductor wafer against said support strut, said spring clip having a cam tip shaped such that when said arm moves into close juxtaposition to said disk electrodes, said cam tip is moved behind said disk electrode moving said spring clip away from said semiconductor wafer, freeing said wafer such that it is retained on said support strut only by gravity.

7. A system in accordance with claim 3 wherein said load mechanism comprises a pair of blade elements mounted within said housing positioned beneath said reaction chamber, means for imparting reciprocating vertical movement to said blades, and wherein said vertical arms consist of a first group, equal in number to the number of disk shaped electrodes on each face of said electrode structure and a second group equal in number to said first group, said first group being mounted on a first one of said blades, and said second group being mounted on the second one of said blades, and means for imparting pivotal movement to said blades such that in a first pivoted position the first group of vertical arms are positioned so that upon reciprocating movement they are carried into close juxtaposition with disk shaped electrodes and, in a second pivoted position, said second group of vertical arms are positioned such that upon reciprocating upward movement they are carried into close juxtaposition with said disk shaped electrodes, said control means being operated such that one group of vertical arms carries semiconductor wafers from said transport mechanism into position on said disk shaped electrode when said blades are in one pivoted position and the other group of vertical arms carries semiconductor wafers from said disk shaped electrodes, when said blades said second pivoted position.

8. A gas plasma reaction system for processing semiconductor wafers comprising,
   a plasma reactor chamber having a centrally located electrode structure formed of a series of longitudinally extended faces, each of said faces being positioned so that in cross-section the electrode structure has a regular polygonal shape, the faces being extended in a horizontal direction, each of said faces having on its surface a plurality of planar disk shaped electrodes for carrying said semiconductor wafers to undergo the plasma reaction during operation, each of said faces being covered by a generally flat tray member having circular openings therein corresponding to the positions of said electrode disks, each of said trays being hinged for pivotal motion from a first position in close parallel juxtaposition with said electrode face to a second position angularly displaced therefrom,
   a loading mechanism disposed generally beneath and outside of said reaction chamber, said loading mechanism including a plurality of vertically extending support arms, each of said support arms being configured to carry a semiconductor wafer and formed such that the reactive surface of said semiconductor wafer is not touched by any portion of said vertically extending arm, the number of said vertically extending arms being at least equal to the number of said electrode disks on a single face of said reactor electrode structure,
   means for imparting motion to said arms for moving said arms from a position beneath said reactor chamber to a position within said reactor chamber such that each arm is in close juxtaposition to a corresponding one of said disk electrodes, and for thereafter withdrawing said arm from said position in close juxtaposition back to a position outside of and beneath said reactor chamber,
   a transport mechanism for providing semiconductor wafers to said loading mechanism when said arms are empty and are positioned beneath and outside of said reactor chamber and for carrying processed wafer disks away from said loading mechanism when said arms are positioned beneath and outside of said reaction chamber after processing, and
   control means for controlling the timing of said load mechanism motion such that said arms are moved into and away from close juxtaposition to said disk electrodes only when said tray members are in said second angularly displaced position.

9. A system in accordance with claim 8 wherein said load mechanism includes a housing formed with a passage between it and said reaction chamber, and means for providing a vacuum tight seal between said housing and said reaction chamber when said arms are in position beneath and outside of said reaction chamber, said housing having a second opening for receiving semiconductor wafers from said transport mechanism only when said reaction chamber passage is closed, and means for providing a vacuum tight closing for said opening.

10. A system in accordance with claim 8 wherein said tray members have a third position in which they are angularly displaced from said first position by an amount less than the angular displacement of said second position and, wherein each of said tray members includes a plurality of resilient elements distributed around the periphery of each of said circular openings, said plurality of resilient elements being formed such that when said tray element is in said first position they can secure a semiconductor wafer to the corresponding disk shaped electrode, and when said tray element is in said third position, said resilent elements are disengaged from said semiconductor wafer, said electrode faces including at least two additional resilient members mounted thereon such that when said tray element is in said third position, said additional resilient members can retain a semiconductor wafer in position on said disk shaped electrode and when said tray element is in said second position, said additional resilient elements release said semiconductor wafer from its position on said disk shaped electrode, said control means operating said vertical arms in a loading cycle by such that after said tray element is moved to said second position, said arms are moved vertically into close juxtaposition with a corresponding one of said disk shaped electrodes so that any semiconductor wafer carried on each of said arms is positioned on, and generally concentric with, a corresponding one of said disk shaped electrodes, and thereafter said tray element is moved to said third position, such that said resilient members mounted on said electrode face retain the semiconductor wafer carried by the corresponding vertical arm onto said disk shaped electrode, said control means operating while said tray element is in said third position to cause said reciprocating means to withdraw said arms from within said reaction chamber to a position beneath and outside of said reaction chamber and to cause said tray element to move to said first position after said vertical arms have withdrawn to a position below said electrode face.

11. A system in accordance with claim 10 wherein said control means operates said vertical arms and said tray elements during an unloading cycle in a sequence such that said tray element moves from said first position to said third position, thereafter said vertical arms are reciprocated into position to accept said semiconductor wafers from a corresponding one of said disk shaped electrodes, then said tray element is moved to said second position to release said semiconductor wafers from said disk shaped electrodes, and said vertical arms are reciprocated to a position beneath and outside of said reaction chamber.

12. A system in accordance with claim 8 wherein said load mechanism comprises a pair of blade elements mounted within said housing positioned beneath said reaction chamber, means for imparting reciprocating vertical movement to said blades, and wherein said vertical arms consist of a first group, equal in number to the number of disk shaped electrodes on each face of said electrode structure and a second group equal in number to said first group, said first group being mounted on a first one of said blades, and said second group being mounted on the second one of said blades, and means for imparting pivotal movement to said blade such that in a first pivoted position the first group of vertical arms are positioned so that upon reciprocating upward they are carried into close juxtaposition with disk shaped electrodes and in a second pivoted position, said second group of vertical arms are positioned such that upon reciprocating upward movement they are carried into close juxtaposition with said disk shaped electrodes, said control means being operated such that one group of vertical arms carries semiconductor wafers from said transport mechanism into position on said disk shaped electrode when said blades are in one pivoted position and the other group of vertical arms carries semiconductor wafers from said disk shaped electrodes, when said blades in said second pivoted position.

13. A system in accordance with claim 8 wherein said vertical support arms are each formed of a support strut and a spring clip positioned to hold a semiconductor wafer against said support strut, said spring clip having a cam tip shaped such that when said arm moves into close juxtaposition to said disk electrodes, said cam tip is moved behind said disk electrode moving said spring clip away from said semiconductor wafer, freeing said wafer such that it is retained on said support strut only by gravity.

14. A system in accordance with claim 9 wherein said transport mechanism includes a conveyor system for moving said semiconductor wafer from a cassette into individual spaced positions adjacent to said second opening, means for opening said vacuum tight closing, and wafer carrier means for lifting said wafers from said conveyor, through said second opening into a position adjacent to said loading mechanism such that said loading mechanism in its upward reciprocating motion can transfer said wafers from said carrier to said vertical arms.

15. A system in accordance wih claim 14 wherein said arms are formed of a support strut and a spring clip positioned to hold a semiconductor wafer against said support strut, said spring clip having a cam tip shaped such that when said arm moves into close juxtaposition to said disk electrodes, said cam tip is moved behind said disk electrode moving said spring clip away from said semiconductor wafer, freeing said wafer such that it is retained on said support strut only by gravity, and wherein said cam tips are forced behind said carriers when said support arms are adjacent to said carriers to allow said wafers to be transported to said support strut.

16. A system in accordance with claim 14 wherein said carriers are generally rectangular shaped vacuum chucks mounted on swing arms, and means for providing a vacuum to said chucks to retain said wafers on said chucks when said carriers are moving said wafers from said transport mechanism to said loading mechanism vertical arms, and to remove said vacuum when said vertical arms have engaged said wafers.

17. A system in accordance with claim 1, wherein said vertical support arms are each formed of a support strut and a pawl means for holding a semiconductor wafer against said support strut, including vertically movable means on which said pawl means is mounted, whereby when said arm moves into close juxtaposition to said disk electrodes, said pawl means is moved down from said semiconductor wafer, freeing said wafer such that it is retained on said support strut only by gravity.

18. A system in accordance with claim 17, wherein said vertically movable means comprises a movable pawl support, resiliently mounted on said vertical support arm, and guide means for guiding said movable pawl support, said guide means being arranged to guide said movable pawl support so that said pawl means is moved transversely away from said semiconductor wafer as well as down from said wafer when said arm moves into close juxtaposition to said disk electrodes.

19. A system in accordance with claim 17, wherein said pawl means has an electrode contact surface for contacting said disk electrode to cause said pawl means to move down from said semiconductor wafer as said arm moves into close juxtaposition to said disk electrode.

20. A system in accordance with claim 3 wherein said additional resilient members comprise a block means and a tab means mounted on said block means, said disk electrode face defining a recess for resiliently, closing seating said block means, and linking means connecting said block means to said tray element whereby said tray element moves said block means from a position in which said tab means engages said semiconductor wafer to a position in which said tab means does not engage said wafer when said tray element moves from the tray element third to the tray element second position.

21. A system in accordance with claim 20 further including biasing means for urging said tab means mounted on said block means toward engagement with said semiconductor wafer, said block means defining a bore through which said linking means extends to engage said block means, said tray element defining a portion closing off said bore when said tray element is in its first position.

22. A system in accordance with claim 5, wherein said vertical support arms are each formed of a support strut and a pawl means for holding a semiconductor wafer against said support strut, including vertically movable means on which said pawl means is mounted, whereby when said arm moves into close juxtaposition to said disk electrodes, said pawl means is moved down from said semiconductor wafer, freeing said wafer such that it is retained on said support strut only by gravity.

23. A system in accordance with claim 17, wherein said vertically movable means comprises a movable pawl support, resiliently mounted on said vertical support arm, and guide means for guiding said movable pawl support, said guide means being arranged to guide said movable pawl support so that said pawl means is moved tranversely away from said semiconductor wafer as well as down from said wafer when said arm moves into close juxtaposition to said disk electrodes.

24. A system in accordance with claim 17, wherein said pawl means has an electrode contact surface for contacting said disk electrode to cause said pawl means to move down from said semiconductor wafer as said arm moves into close juxtaposition to said disk electrode.

25. A system in accordance with claim 8, wherein said vertical support arms are each formed of a support strut and a pawl means for holding a semiconductor wafer against said support strut, including vertically movable means on which said pawl means is mounted, whereby when said arm moves into close juxtaposition to said disk electrodes, said pawl means is moved down from said semiconductor wafer, freeing said wafer such that it is retained on said support strut only by gravity.

26. A system in accordance with claim 17, wherein said vertically movable means comprises a movable pawl support, resiliently mounted on said vertical support arm, and guide means for guiding said movable pawl support, said guide means being arranged to guide said movable pawl support so that said pawl means is moved transversely away from said semiconductor wafer as well as down from said wafer when said arm moves into close juxtaposition to said disk electrodes.

27. A system in accordance with claim 17, wherein said pawl means has an electrode contact surface for contacting said disk electrode to cause said pawl means to move down from said semiconductor wafer as said arm moves into close juxtaposition to said disk electrode.

* * * * *